(12) United States Patent
McCormack et al.

(10) Patent No.: US 6,996,202 B2
(45) Date of Patent: Feb. 7, 2006

(54) MULTIPLE CHANNEL ADAPTIVE DATA RECOVERY SYSTEM

(75) Inventors: Gary D. McCormack, Tigard, OR (US); Ronald F. Talaga, Jr., Lake Oswego, OR (US)

(73) Assignee: Vitesse Semiconductor Corporation, Camarillo, CA (US)

( * ) Notice: Subject to any disclaimer, the term of this patent is extended or adjusted under 35 U.S.C. 154(b) by 333 days.

(21) Appl. No.: 10/266,383

(22) Filed: Oct. 7, 2002

(65) Prior Publication Data

US 2003/0031282 A1  Feb. 13, 2003

Related U.S. Application Data

(63) Continuation of application No. 09/531,277, filed on Mar. 20, 2000, now Pat. No. 6,463,109, which is a continuation-in-part of application No. 09/139,252, filed on Aug. 25, 1998, now Pat. No. 6,178,213.

(51) Int. Cl.
*H04L 7/00* (2006.01)

(52) U.S. Cl. .................................. 375/355; 375/225

(58) Field of Classification Search ................ 375/224, 375/225, 229, 324, 354, 355, 371, 373; 370/503, 370/516, 517
See application file for complete search history.

(56) References Cited

U.S. PATENT DOCUMENTS

| 3,557,308 | A | * | 1/1971 | Alexander et al. | ........... 375/376 |
| 5,757,857 | A | * | 5/1998 | Buchwald | .................... 375/271 |
| 5,940,449 | A | * | 8/1999 | Kaaden et al. | .............. 375/341 |
| 5,991,346 | A | * | 11/1999 | Lu | ............................. 375/355 |
| 6,188,737 | B1 | * | 2/2001 | Bruce et al. | ................. 375/355 |

* cited by examiner

*Primary Examiner*—Chieh M. Fan
(74) *Attorney, Agent, or Firm*—Christie, Parker & Hale, LLP

(57) ABSTRACT

A microprocessor controlled data recovery unit with an adjustable sampling and signal comparison level. The data recovery unit includes a data channel and a monitor channel. The monitor channel samples an incoming data stream in a varying manner. The results of the sampling in the monitor channel are used to adjust the sampling and comparing of the signal in the data channel. The data recovery unit includes a PLL based clock recovery unit in one embodiment, and in another embodiment the clock signal is derived by the microprocessor.

12 Claims, 17 Drawing Sheets

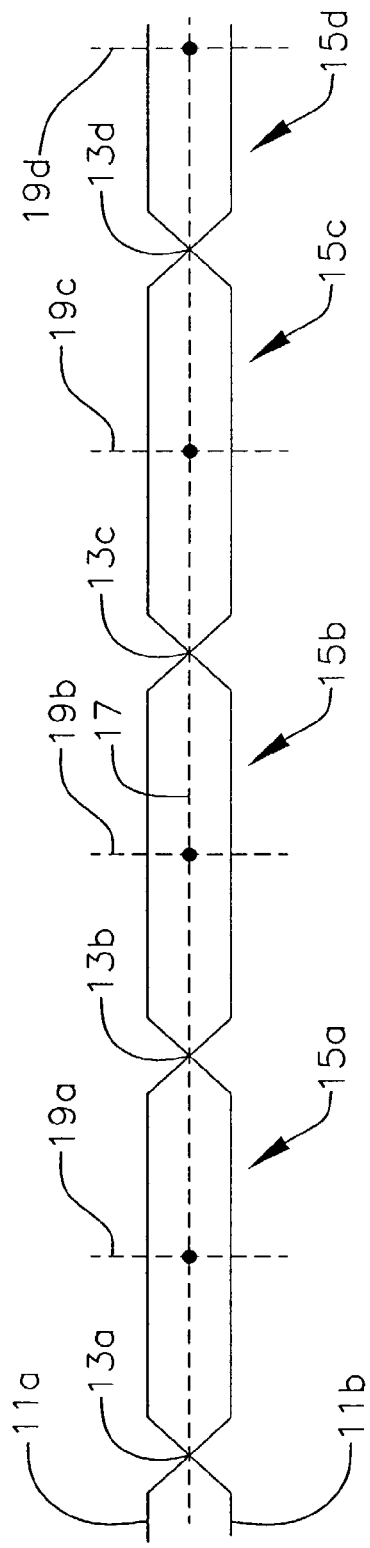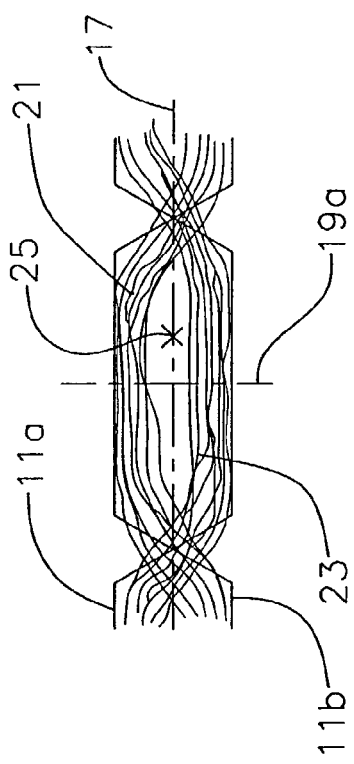

MULTIPLE CHANNEL ADAPTIVE DATA RECOVERY SYSTEM

CROSS-REFERENCE TO RELATED APPLICATION(S)

The present application is a continuation application of U.S. patent application Ser. No. 09/531,277, filed Mar. 20, 2000, issued Oct. 8, 2002 as U.S. Pat. No. 6,463,109 entitled "MULTIPLE CHANNEL ADAPTIVE DATA RECOVERY SYSTEM", and which is a continuation-in-part of U.S. patent application Ser. No. 09/139,252, filed Aug. 25, 1998, now U.S. Pat. No. 6,178,213, issued Jan. 23, 2001, both disclosures of which are incorporated herein by reference.

BACKGROUND OF THE INVENTION

This invention relates generally to digital data communication systems, and more particularly to recovering clock signals and digital data from a serial data signal.

Modern data communication systems are required to accurately transmit and receive digital information at high data transmission rates. The digital information is often transmitted great distances over a variety of communication mediums such as electrically conducting wires and, commonly now, optical fibers. Great demands as to speed and reliability are placed on these systems. One measure of reliability of such systems is the bit error rate (BER) of the system, and modern communication systems are required to have exceedingly low bit error rates.

When a receiving unit in a data communication system receives a signal, generally an electrical or optical signal, containing digital information, the receiving unit must recover the digital information from the signal. In other words, if a transmitter transmits a signal containing information corresponding to a particular bit sequence, then the receiving unit must recover the particular bit sequence from the received signal.

In addition, often the received data signal does not include a separate clock signal or other direct indication of the demarcation within the signal between the separate bits making up the signal. For example, when bit sequences are transmitted in a non-return to zero (NRZ) format, a logic 1 bit is indicated by a signal at a first energy level, and a logic 0 bit is indicated by a signal at a second (usually lower) energy level. The clock signal used to define the bit sequence by demarcating the bits within the sequence is not explicitly transmitted to the receiving unit. Data formats, such as NRZ, which do not provide inherent demarcation between bits in the data stream are often preferred because such formats have greater bandwidth as clock information is not explicitly required to be transmitted. Accordingly, receiving units must generally be able to recover clock information from the received signal, and then use that recovered clock information to determine the bit sequences contained in the received signal.

Systems for recovering clock and data information from data communicated according to data formats such as an NRZ format are known. Often such systems use a phase locked loop (PLL) to determine a clock signal corresponding to the clock used to generate the data stream. PLLs use a clock generator generating a clock signal at what is hoped to be the same frequency as the clock frequency of the transmitter, and adjusts the phase of the generated clock signal to form a phase adjusted clock signal based on information implicitly contained in the data signal. Periodic transitions, generally positive edge transitions, of the phase adjusted clock signal are used as timing points at which the data signal is sampled by comparing the data signal to a set energy level. If the energy level, usually in volts, is above the set energy level a logic 1 bit is placed in the bit sequence. If the energy level is below the set energy level a logic 0 is placed in the bit sequence.

FIG. 1 illustrates dual semi-idealized digital waveforms of data signals. A y-axis represents voltage of the data signals, and an x-axis represents time. As illustrated, a waveform of a first data signal 11a represents a binary sequence of alternating logic 1s and 0s. A waveform of a second data signal 11b represents the complement of the alternating binary sequence of the first binary sequence. The waveforms deviate from ideal waveforms in that each has a finite rise time and fall time when transitioning to and from a logic level 1 and a logic level 0.

The waveforms are divisible over time into a number of data cells 15a–d. Each of the data cells 15a–d represents one bit of data in a sequence of bits. In order to reconstruct the transmitted binary sequence the data signal is sampled and compared once for each data cell, generally at the expected midpoint in time of the data cell. Sampling is performed at defined intervals, generally in what is expected to be the middle of the period of an idealized data cell. Comparing is accomplished by comparing an energy level, generally a voltage, of the data signal with a pre-defined energy level, or voltage, which is generally in the middle of the expected range of energy levels. Thus, if the first data signal 11a is sampled once in each of the data cells 15a–d at times 19a–d using a voltage reference 17, the resulting bit pattern is 0101. Similarly sampling the second data signal results in a bit pattern of 1010.

Such systems are prone to errors, however. Slight differences in frequency between the transmitter clock and the clock generator of the receiving unit may lead to data recovery errors over time, or at least require periodic reacquisition of the correct phase adjusted clock signal, with a loss of bandwidth during the reacquisition period. In addition, deviations from an ideal transmitted data signal and distortions in transmitted signals, whether generated by properties of the transmitter, the communication medium, or otherwise, may result in data recovery errors. There are many causes of such deviations and distortions, and the deviations may change from transmitted bit to transmitted bit as well as exhibit both drift and an increase in the magnitude of the deviations over time as components age.

The transmitter may transmit signals that deviate from the ideal in terms of rise time, fall time, and energy levels. These deviations may vary from transmitter to transmitter, and even over time for a single transmitter. To an extent, these deviations may also vary from bit to bit for a single transmitter. Additionally, the transmitter and receiving unit may not have clocks perfectly aligned in frequency or phase, thus increasing the difficulty in the translation. Further, properties of the communication medium may distort the transmitted signals, and a receiver utilized by the receiving unit may also cause distortion of the signals. Accordingly, systems and methods for increasing communication system reliability in view of such problems are desirable.

SUMMARY OF THE INVENTION

The present invention therefore provides systems and methods for providing clock and data recovery from digital communication signals. In one embodiment the present invention comprises is a data recovery system. A data recovery system includes means for receiving data signals and means for splitting the data signal into a plurality data channel signals and a replacement channel signal. The data channel signals are digitized by digitizers to obtain a data out signals, and the replacement channel signal is digitized by a digitizer to obtain a replacement out signal. The data out signal and the monitor out signal are compared using comparison means, the comparison means providing a result which is used to adjust the digitization of at least one of the data channel signal. The digitization of the signals occurs by comparing the signals to reference energy levels to provide an intermediate signal, and periodically sampling the intermediate signal. The comparing and sampling of the replacement channel signal is varied to determine the edges of a data eye of a data cell, and the edges of the data cell are used to determine a center of gravity of the data eye to be used as a digitization point for the data signal in the data channel. The varying of the digitization point of the replacement channel is accomplished by changing the reference energy level for the replacement channel as well as changing the phase of a clock signal used for periodically sampling the intermediate signal. In one embodiment, the edges of the data eye are determined when a bit error rate between a data channel signal and the replacement channel out signal is greater than a predefined value.

In one embodiment a comparator is used as comparison means and a latch or a flip flop is used as a sampling means. Digital to analog convertors under the control of a controller, processor, or microprocessor generate a reference voltage for use by a comparator. Similarly, a controllable delay element, under the control of the controller, processor, or microprocessor, provides a phase adjusted version of a master clock signal which is used to vary a sampling point as a clock signal to the latch.

Many of the attendant features of this invention will be more readily appreciated as the same becomes better understood by reference to the following detailed description and considered in connection with the accompanied drawings in which like reference symbols designate like parts throughout.

DESCRIPTION OF THE DRAWINGS

FIG. 1 illustrates a semi-idealized incoming data waveform;

FIG. 2 illustrates a data cell of the semi-idealized waveform of FIG. 1, along with a data-eye of an expected actual waveform;

DETAILED DESCRIPTION

FIG. 2 illustrates a possible actual data-eye of a single data cell. The data eye is formed by superimposing waveforms of a plurality of data signals over a single data cell. A first plurality of varying data signals 21 are data signals having the same bit sequence as the first data signal 11a, and a second plurality of varying data signals 23 are data signals having a bit sequence corresponding to the bit sequence of the second data signal 11b. As illustrated, the plurality of data signals vary substantially from the data signals. The plurality of data signals generally to do not reach the expected upper voltage level, or the expected lower voltage level. The plurality of data signals additionally exhibit increased rise times, decreased steady state times, and increased fall times. In addition to varying from the data signals, the plurality of data signals vary from each other, having different waveforms. Moreover, the variations in rise time, fall time, and steady state time are not symmetric. That is, the center of the data cell is not the point most equidistant from all of the waveforms making up the data-eye. Accordingly, sampling and comparing the center of the idealized data-eye will not result in the lowest likelihood that a particular data bit will be correctly recovered, and therefore is not expected to result in the lowest bit error rate.

Figure 3:
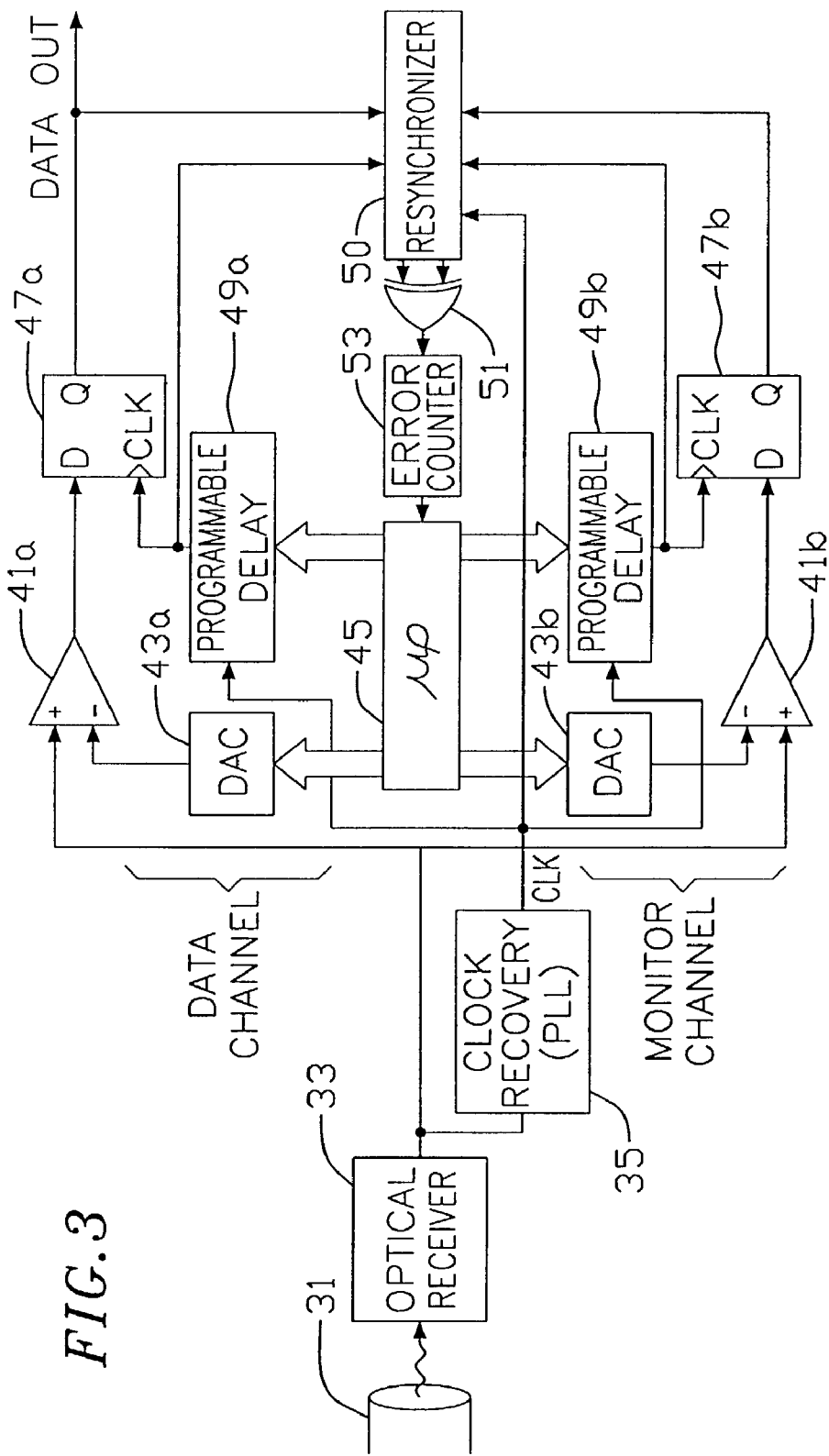
FIG. 3 illustrates a semi-schematic block diagram of a receiving unit of the present invention for obtaining digital data from an incoming data stream transported over a fiber optic cable.

FIG. 3 illustrates a semi-schematic of a clock and data recovery unit of the present invention. A data signal is transmitted over a fiber optic cable 31 by a transmitter (not shown). The fiber optic cable is coupled to an optical receiver 33. The optical receiver receives the light transmissions transmitted by the fiber optic cable and converts those light transmissions into electrical signals. Fiber optic cables and optical receivers are well known in the art, and are widely available from a variety of sources. In some communication networks wavelength division multiplexing is used in which signals corresponding to the input optical signal are comprised of a plurality of signals each transmitted at differing wavelengths, with the plurality of signals transmitted simultaneously over the same optical fiber. When such signals are received by the optical receiver the signals require wavelength demultiplexing. Apparatus and methods for doing so are well known in the art. Accordingly, for ease of further description, it will be assumed that the input optical signal comprises a single data signal. Generally, the fiber optic cable and optical receiver unit are not components of clock and data recovery units. For purposes of clarity of description, however, they are included in FIG. 3 and in other figures described herein.

The optical receiver produces an optical receiver output signal which is provided to a PLL-based clock recovery unit (CRU) 35. The CRU determines a master clock signal (CLK) based on the optical receiver output signal and a reference clock signal in a manner similar to previously described.

The optical receiver output signal is also provided to data channel circuitry and monitor channel circuitry. The data channel circuitry samples and compares the output of the optical receiver to form a data out signal for use by a receiving system of which the clock and data recovery unit is a part. The monitor channel circuitry also samples and compares the output of the optical receiver. The purpose of the monitor channel circuitry, however, is to gather information regarding the optical receiver output signal. This information is provided to a controller, which uses the information to adjust the sampling and comparing by the data channel in order to minimize receiving unit bit error rates.

The data channel circuitry includes a data path comparator 41a which compares the signal generated by the optical receiver to a voltage threshold. The voltage threshold is generated by a data path digital-to-analog converter 43a based on a bit pattern generated by a controller 45. The output of the data channel comparator 41a is provided to a data channel latch 47a as a data channel latch data input signal. The data channel latch 47a is also provided a data channel clock signal. When the data channel clock signal transitions from a logic 0 state to logic 1 state the data channel latch sets a data out signal to the same logic value as the data channel latch data input signal.

The data channel clock signal provided to the data channel latch 47a is generated by a data channel programmable delay element 49a. The data channel programmable delay element 49a receives the master clock signal generated by the CRU. The data programmable delay element delays the clock signal generated by the CRU as instructed by the controller.

The monitor channel circuitry forms a mirror image of the data channel circuitry. Accordingly, the monitor channel circuitry includes a monitor channel comparator 41b for comparing the optical receiver output signal with a voltage generated by a monitor channel digital-to-analog converter 43b. The monitor channel digital-to-analog converter 43b is also under control of the microprocessor 45. The output of the monitor channel comparator 41b is provided to a monitor channel latch 47b. The monitor channel latch 47b is provided a monitor channel clock signal from a monitor channel programmable delay element 49b, which delays the clock signal generated by the CRU as commanded by the controller. When the monitor channel clock signal transitions from a logic 0 state to logic 1 state the monitor channel latch sets a monitor out signal to the same logic value as the monitor channel latch data input signal.

The data out signal, in addition to being provided to the receiving system for further use, is provided to a resynchronizer 50. The resynchronizer also receives the monitor out signal, the master clock signal, and the data and monitor channel clock signals. The resynchronizer correlates a data out signal and monitor out signal pair from a single data cell, cancels the skew between the two signals, and reclocks the signals to the master clock signal. The resychronizer therefore has as outputs a resynchronized data out signal and a resynchronized monitor out signal. The resynchronized signals are provided to an exclusive OR gate 51. Accordingly, the output of the XOR gate is a logic 1 when the resynchronized data out signal of the data channel path is not equal to the resynchronized monitor out signal of the monitor channel path. An inequality between the resynchronized data out signal and the resynchronized monitor out signal indicates that the two signals were sampled and compared on different sides of a transition in the optical receiver output signal. Accordingly, the output of the XOR gate can be used to determine the waveforms of data transitions in the received signal, and therefore determine the boundaries of the data eye for the system.

The output of the XOR gate is provided to an error counter 53. In one embodiment the error counter also receives the master clock signal. The error counter determines the number of bit errors occurring over a predefined period of time and provides that information, corresponding to a bit error rate between the data out signal and the monitor out signal, to the controller.

The controller, having control of the delays used to determine sampling points and of the voltages used as comparison references, is therefore able to determine the shape of the waveforms 21 and 23, and thus the shape of the data eye, of the optical receiver output signal.

This is accomplished by initially placing the compare and sample point at the expected middle of the data cell. Thereafter the compare and sample point is moved up in the data cell, i.e. the compare voltage is incrementally increased, until the bit error rate between the monitor out signal and the data out signal reaches a predefined level. The controller or microprocessor stores this compare and sample point as one point defining the edge of the data eye. The compare and sample point for the monitor channel is then moved down in the data cell, i.e. the reference voltage is incrementally decreased, until the predefined bit error rate is reached. The compare and sample point is then once again placed at the expected middle of the data cell, and the sample point is phase shifted in time towards the left, i.e. the beginning, of the data cell. The process is then repeated for the right edge of the data cell, as well as each diagonal direction within the data cell. The microprocessor then uses the eight points in the data cell so located to determine a "center of gravity" of the data cell. The center of gravity of the data cell is then used by the microprocessor to determine the compare and sample point for use in the data channel.

In another embodiment, the compare and sample point is moved up in the data cell, and the bit error rate between the monitor out signal and the data out signal is tracked. The bit error rates are tabulated to determine rates of change of bit error rates with respect to phase or voltage changes in the sampling point. The locations approximate the steepest slope, i.e., where the bit error rate increases substantially are identified as cell edge boundaries.

A convenient way to determine data eye form, particularly with respect to voltage, is to first place a sampling point for one channel at a maximum, particularly a maximum voltage. At a maximum voltage data from a data stream is expected to be all logic highs. The sampling point for a second channel is then adjusted. For data signals having a uniform data density, a data eye is defined by bit error rates between the first and second channels appropriate for the uniform data density.

In another embodiment, the sample point at the bottom of the steepest slope of a graph of bit errors versus sampling point location is determined to be the edge of the data eye. Alternatively, logarithmic plots are developed based on the bit error rates and the edges of the data eye is extrapolated from the logarithmic plots.

In alternative embodiments the compare and sample point is initially placed without regard for the location, expected or otherwise, of the center of the data cell. Instead, the compare and sample point is moved throughout the cell, particularly with respect to phase, to determine data transition boundaries. Regions of high bit error rates define data transition boundaries.

By constantly repeating one or more of the above processes, the receiving unit adaptively adjusts to time varying changes in the shape of the data eye.

For VCOs able to operate in a wide range of frequencies, a phase-locked loop (PLL) used to lock the VCO to a specific frequency may instead lock to a frequency other than the actual data rate. In other words, the PLL may false lock. False locking occurs when the PLL locks to a frequency that is not the frequency at which the incoming data stream is being transmitted. To prevent false locking from occurring, the microprocessor 45, coupled to the PLL 35, is configured to cause the PLL to traverse the oscillator ranges of the VCO to determine potential data rates. For potential data rates the microprocessor then uses the monitor channel to determine if data transition density patterns, i.e., bit error rates between the monitor channel and the data channel, indicate that the PLL has false locked.

In one embodiment, the microprocessor determines if the PLL is locked through examination of the PLL loop filter voltage. When the VCO of the PLL is locked at a frequency, i.e., not being commanded to increase or decrease in frequency, the loop filter voltage is generally approximate a bias voltage. The loop bias voltage can increase and decrease to a small degree to tune the VCO and the VCO remains locked. However, if the loop bias voltage increases or decreases too much, then the VCO is being commanded to significantly change its frequency and the VCO is no longer locked.

In one embodiment, the loop bias voltage is indicated by a loop bias register. The microprocessor reads the loop bias voltage from the loop bias register. The loop bias register includes a loop bias low bit and a loop bias high bit. The loop bias high bit is set when the loop bias voltage exceeds a high reference voltage. The high reference voltage represents a threshold voltage above which the VCO output will not substantially increase in frequency, i.e., not tune. The loop bias low bit is set when the loop bias voltage goes below a low reference voltage. The low reference voltage represents a threshold voltage below which the VCO output will not substantially decrease in frequency, i.e., not tune. Therefore, the loop bias register establishes a window or range that indicates that the loop bias voltage is between a low reference voltage and high reference voltage. If the loop bias voltage is within the loop bias range, then the VCO is tuned and thus locked to a frequency.

In one embodiment, the loop bias register is set by a threshold detector. The threshold detector monitors a VCO driver circuit which drives or tunes the VCO to a frequency. When the threshold detector detects the VCO driver circuit driving the VCO beyond the VCO's tuning range, the threshold detector sets the loop bias high bit. Conversely, when the threshold detector detects the VCO driver circuit driving the VCO below the VCO's tuning range, the threshold detector sets the loop bias low bit.

The microprocessor determines if the VCO is false locked once the loop bias values indicate that the VCO is locked. In one embodiment, the microprocessor is configured to command the phase shift adjustment for the monitor channel to sweep from the expected center point of a data cell to the expected cell boundary. So long as the input data is uniform, placing the monitor channel phase at the actual cell boundary should result in appreciable bit error rates, particularly indicating errors in approximately 50 percent of the data bits. Appreciable bit error rates prior to the expected cell boundary, or a lack of appreciable bit error rates approximate the expected cell boundary, indicate a false lock.

In one embodiment, a prescaler is used to divide the clock signal provided by the PLL to the data channels. The use of the prescaler provides for increased frequency range. The prescaler receives the clock signal generated by the PLL and a control signal from the microprocessor. The prescaler, in response to the control signal, divides the clock signal by an integer value.

In addition, in one embodiment the oscillator has selectable ranges. Thus, in the one embodiment the microprocessor traverses the prescale rates and oscillator ranges. By traversing the prescale rates and the oscillator ranges and examining the error counts provided by the error counter, the microprocessor determines the optimal prescale rate and oscillator range, i.e., the optimal PLL settings to be used by the PLL to lock.

Figure 4:
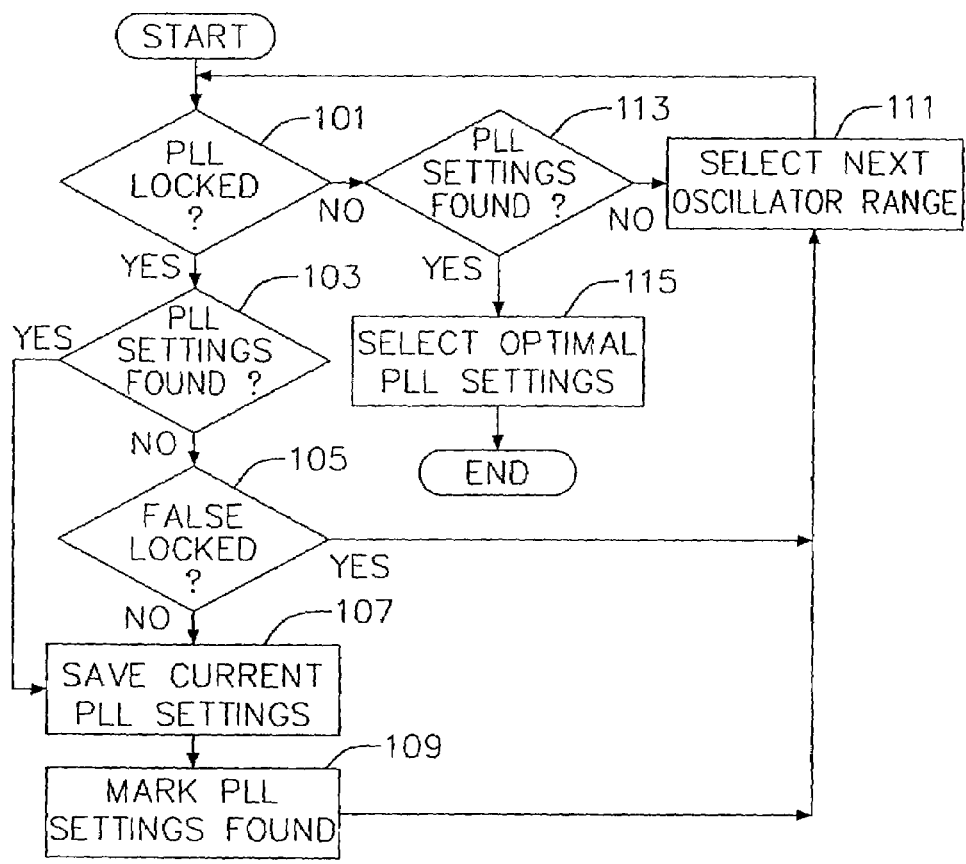
FIG. 4 is a flow diagram of a process for selecting PLL settings.

FIG. 4 illustrates a flow diagram of determining an optimal frequency lock for the PLL. The process starts from the lowest prescale rate and oscillator range of the PLL and increments or advances through the prescale rates and oscillator ranges to the highest prescale rate and the highest oscillator range to determine the optimal prescale rate and oscillator range, i.e., the optimal PLL setting. In other words, the process finds two or more candidate PLL settings, one prescale rate with two or more oscillator ranges in which the PLL locks. The process then selects the highest or middle candidate PLL setting to be the optimal PLL setting. The prescale rate, in one embodiment, varies from 1 to 256. The oscillator, in one embodiment, has seven ranges.

In step 101, the process determines if the VCO of the PLL is locked. In one embodiment, the process examines the loop bias register to determine if the current state of the VCO of the PLL is locked or not locked. If, in step 101, the process determines that the loop bias high bit and the loop bias low bit are not set, then the loop bias is in range, i.e., the PLL is locked.

If, in step 101, the process determines that the loop bias is in range, then the process in step 103 determines if a candidate PLL setting has been found. If in step 103, the process determines that no candidate PLL setting has been found then the process continues to step 105 and tests for a false lock. If a false lock is found by the process in step 105 then the process continues to the next oscillator range setting, i.e., incremented by one oscillator range from the previous oscillator range setting, in step 111. However, if a false lock is not found by the process in step 105 then the process saves or marks the current oscillator range setting and prescale rate to be a candidate PLL setting in step 107.

In one embodiment, a cycle counter is utilized that counts the number of candidate PLL settings found. In other words, the cycle counter counts the number of oscillator ranges and prescale rates that have been traversed and that are within the loop bias range, i.e., the VCO of the PLL is locked. In step 109, the process increments the cycle counter to signify that a candidate PLL setting has been found. The process then continues to the next oscillator range settings in step 111.

If in step 103 the process determines that other candidate PLL settings have been found then the process continues to step 107 to save the current PLL settings. The cycle counter is then incremented by the process in step 109 to signify that another candidate PLL setting has been found. The process then continues to the next oscillator range settings in step 111.

However, if, in step 101, the loop bias high bit or the loop bias low bit is set then the loop bias is out of range, i.e., the VCO of the PLL is not locked, and the process continues to step 113 to determine if other candidate PLL settings have been found. If in step 113, the process determines that no other candidate PLL settings have been found, the process continues to the next oscillator range setting in step 111. The process then repeats, starting at step 101, by examining the loop bias register.

If the process determines that other candidate PLL settings have been found in step 113, e.g., the cycle counter is not equal to zero, then the process in step 115 examines the candidate PLL settings found to determine the optimal PLL settings. The process thereafter returns. If two candidate PLL settings in a row have been found, the second candidate PLL setting is selected as the optimal PLL setting, i.e., the higher prescale rate and oscillator range values are selected. If three candidate PLL settings in a row have been found, the middle candidate PLL setting is selected as the optimal PLL setting, i.e., the middle prescale rate and oscillator range values are selected. Similarly, if four candidate PLL settings in a row have been found, the third greatest candidate PLL setting is selected as the optimal PLL setting.

Figure 5:
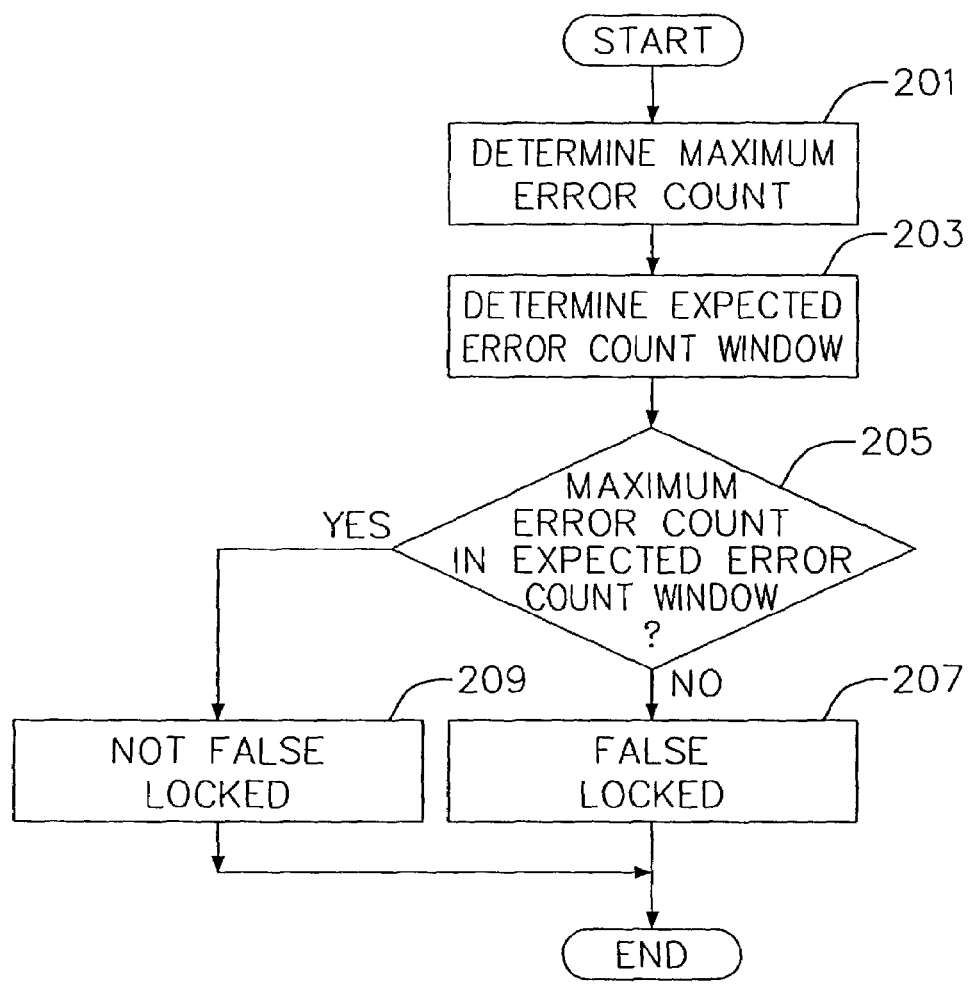
FIG. 5 is a flow diagram of a process for determining if a PLL has false locked.

FIG. 5 illustrates a flow diagram of testing for a false lock as described in step 105 in FIG. 4. In step 201, the process determines the maximum error count. In one embodiment, the process determines the maximum error count by examining error count registers updated with information provided by the error counter. The error counter determines a first set of error counts for a clock phase setting ranging from zero to 63 (0 to 360 degrees). Likewise, the error counter determines a second set of error counts for a clock phase settings ranging from 0 to 63 with an offset of 180 degrees. The error counter updates the error registers corresponding to the first set of error counts and the second set of error counts. By taking the difference between the first set of error counts and the second set of error counts determined by the error counter, a third set of error counts is determined by the process. The largest number of error counts from the third set of error counts is determined to be the maximum error count. Therefore, the process determines the maximum error count by determining a set of differential error measurements over sixty-four clock phase settings and selecting the largest error in the set of differential error measurements.

In another embodiment, the error counter determines an error count for a clock phase setting of 0° and offset 180° offset clock phase setting. The process determines a differential error count which is the difference between the error counts for a clock phase setting of 0° and offset 180°. The process commands the error counter to continue to determine error counts for a clock phase setting up to 360° and the corresponding 180° clock phase setting. As the error counter determines each error count, the process determines the differential error count. The largest differential error count calculated by the process is determined to be the maximum error count. The corresponding offset 180° clock phase setting is described in more detail with respect to FIG. 16.

In step 203, the process determines the expected error count. In one embodiment, the expected error count is determined by dividing the total errors at a full data rate, by the current prescale rate. For example, if bit errors are stored in a 15 bit accumulator then the expected period required to overflow the accumulator must be modified by the prescale rate. In another embodiment, the expected error count is calculated by multiplying the received error count by the current prescale rate. Using a margin window of plus or minus 12.5 percent, the process determines a low expected error count, the expected error count minus the margin window, and a high expected error count, the expected error count plus the margin window. In step 205, the process compares the maximum error count to the low expected error count and to the high expected error count. If, in step 205, the process determines that the maximum error count exceeds the maximum expected error count or is below the minimum expected error count, then the process determines that a false lock has occurred in step 207 and the process returns. However, if in step 205, the process determines that the maximum error count exceeds the minimum expected error count and is below the maximum expected error count, then the process determines that a false lock has not occurred in step 209 and then the process ends.

Figure 6:
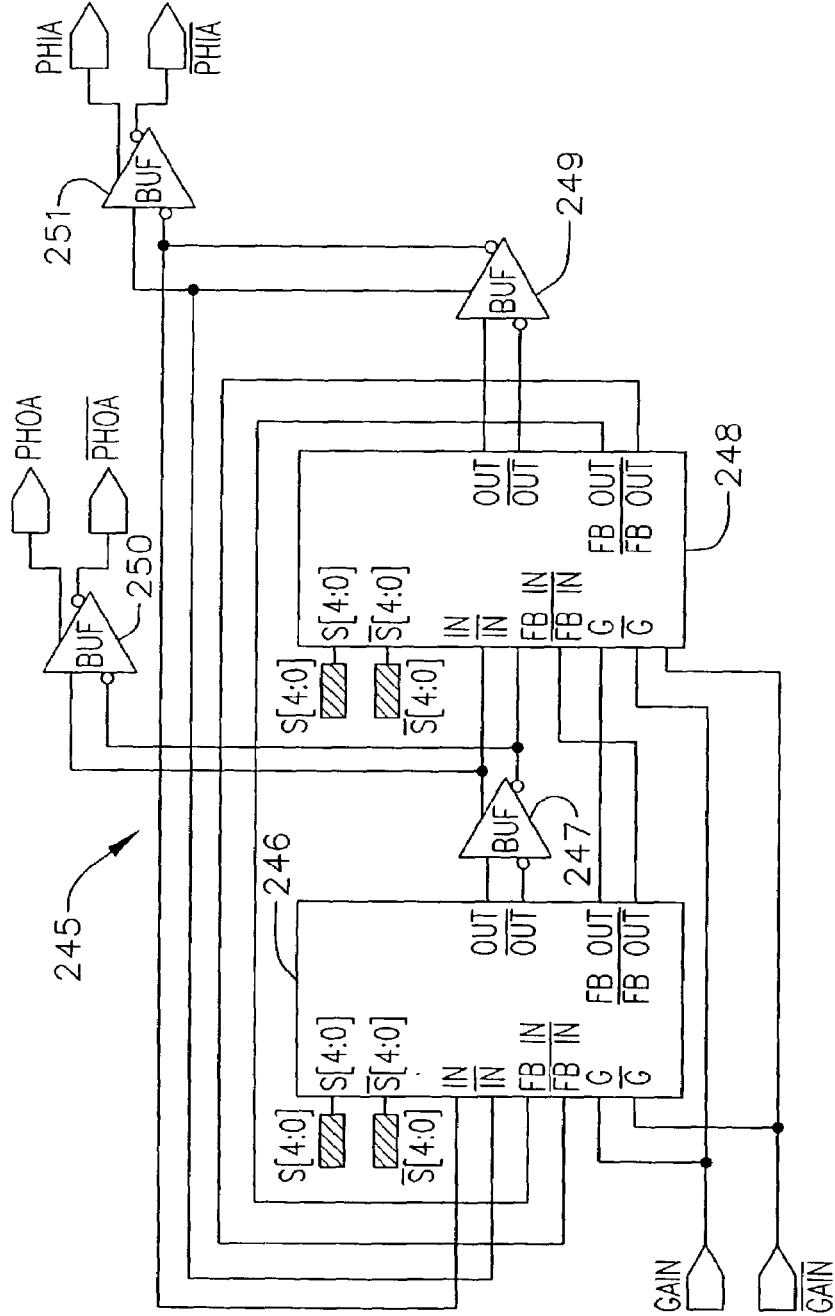
FIG. 6 illustrates a oscillator having oscillator stages with ranging.
Figure 7:
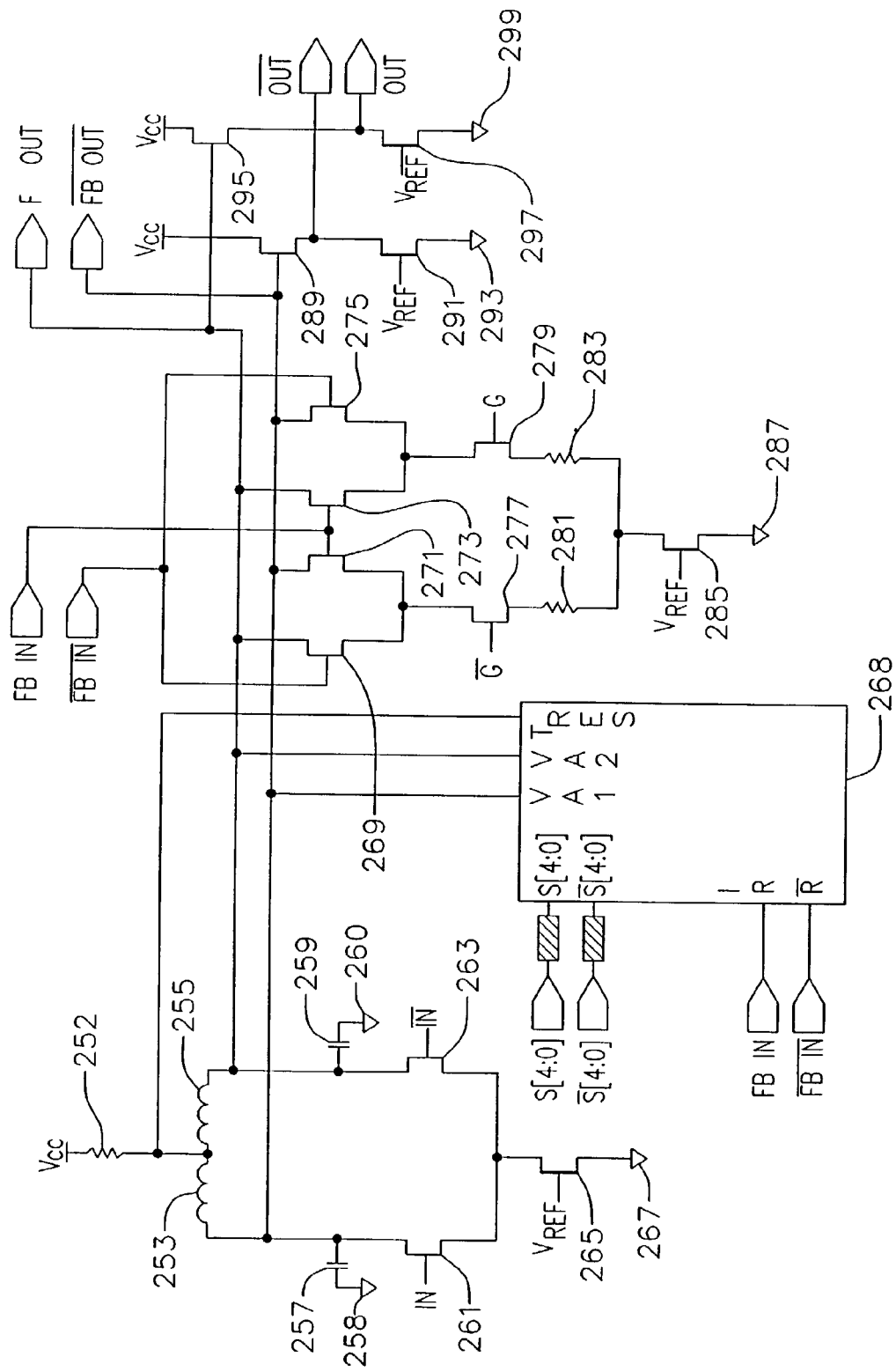
FIG. 7 illustrates an oscillator stage with ranging of the oscillator of FIG. 6.
Figure 8:
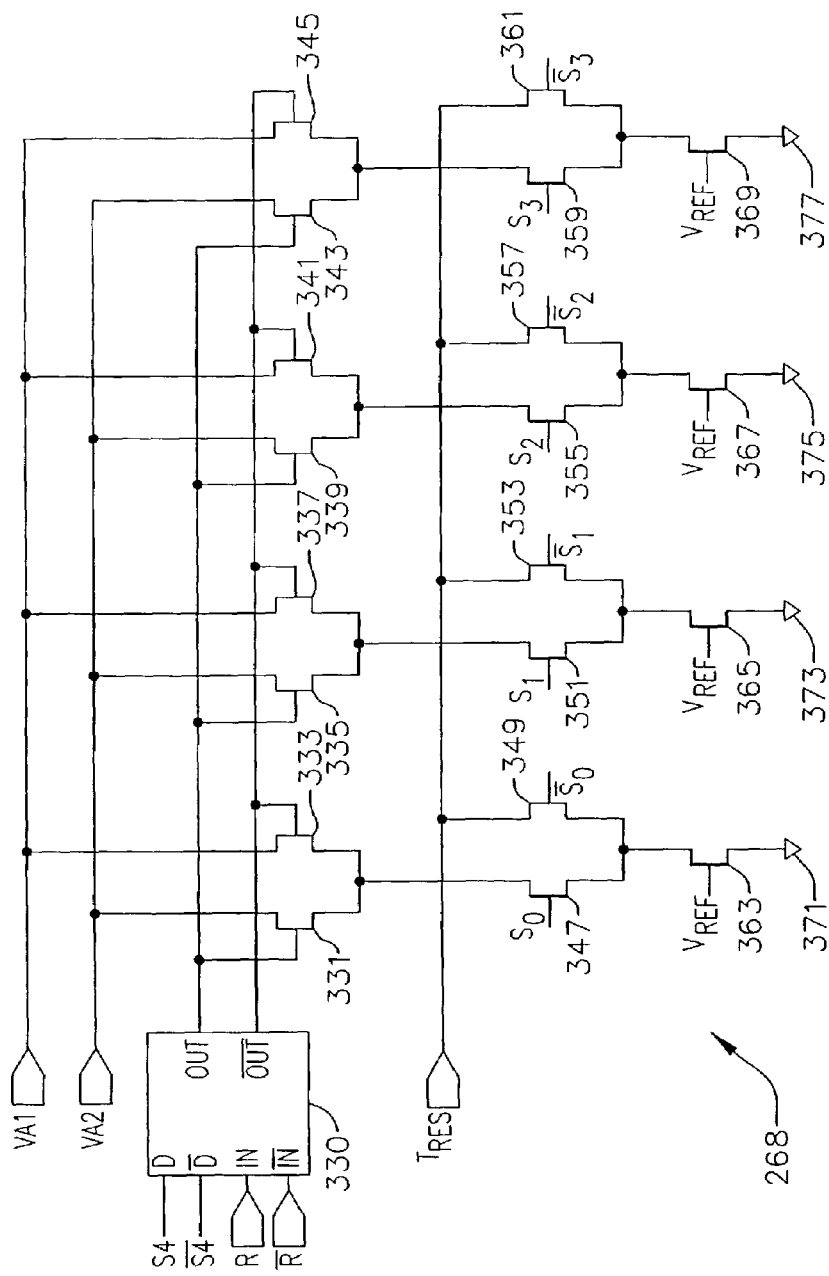
FIG. 8 illustrates a ranging circuit of the oscillator stage with ranging of FIG. 7.

Some embodiments of the invention utilize a VCO such as illustrated in FIGS. 6–8. FIGS. 6–8 illustrate a controlled frequency oscillator with a wide tuning range. The controlled oscillator circuit receives an external input stimulus and generates an oscillating output signal. A phase shifting element controls a phase of a current flowing through the current source with respect to a phase of the oscillating output signal.

Over a frequency range of operation of the controlled oscillator circuit, an oscillation frequency of the oscillating output signal is substantially linearly dependent on the current flowing through the current source element. Therefore, by using a gain-controllable current source as the current source element, the oscillation frequency of the oscillating output signal is be varied.

More specifically, FIG. 6 illustrates a block diagram of a oscillator 245 having two oscillator stages with ranging, 246 and 248. This oscillator with ranging comprises two oscillator stages 246 and 248, and two buffers 247 and 249. Buffers 250 and 251 are provided as output drivers. Two pairs of differential output signals of the oscillator stage with ranging 246, OUT/OUT and FB OUT/FB_OUT are supplied as inputs to a buffer 247 and as an inverted feedback input into the oscillator stage 248, respectively. A pair of differential output signals of the buffer 247, in turn, is supplied as an input to the oscillator stage 248. Two pairs of differential output signals, OUT/OUT and FB OUT/FB_OUT, of the oscillator stage 248, in turn, are supplied to the buffer 249 as an input and as a feedback input into the oscillator stage 246, respectively. Finally, to complete the ring, a pair of different output signals of the buffer 249 is supplied to the oscillator stage 246 as an inverted input. This is one embodiment of a oscillator with ranging.

FIG. 7 illustrates an oscillator stage with ranging 246 (248). A first end of a resistor 252 is coupled to Vcc. A second end of the resistor 252 is coupled to a first end of a first inductor 253 and a first end of a second inductor 255. A second end of the first inductor 253 is coupled to a first end of a first capacitor 257, and a second end of the second inductor 255 is coupled to a first end of a second capacitor 259. A second end of the first capacitor 257 and a second end of the second capacitor 259 are coupled to common 258 and 260, respectively. The first inductor 253 and the first capacitor 257 pair, and the second inductor 255 and the second capacitor 259 pair comprise LC tank circuits. The resistor 252 coupled between the LC tank circuits and Vcc is a biasing resistor for bringing down the reference voltage of operation of the LC tank circuit to below Vcc, shifting a common-mode operation voltage.

The second ends of the inductors 253 and 255 are also coupled to drains of transistors 261 and 263, respectively. Gates of the transistors 261 and 263 are used to input a pair of differential input signals, IN and $\overline{\text{IN}}$, respectively. IN and $\overline{\text{IN}}$ are inputs to the oscillator stage with ranging. Sources of the transistors 261 and 263 are coupled to a drain of a transistor 265. A source of the transistor 265 is coupled to a common 267. A gate of the transistor 265 is coupled to a reference voltage, $V_{REF}$.

The transistor 265 operates as a current source, and a current flowing through the transistor 265 is controlled only by $V_{REF}$. Therefore, if $V_{REF}$ remains fixed, the current flowing through the transistor 265 is substantially constant at all times of operation. Therefore, the differential input signals, IN and $\overline{\text{IN}}$, applied at the gates of the transistors 261 and 263, respectively, determine the ratio of $I_{DS}$ currents flowing respectively through transistor 261 and transistor 263.

Drains of transistors 269 and 273 are coupled to the second end of the second inductor 255, and drains of transistors 271 and 275 are coupled to the second end of the first inductor 253. Gates of the transistors 271 and 273 are coupled to FB IN signal from another oscillator stage. Gates of the transistors 269 and 275 are coupled to $\overline{\text{FB IN}}$ signal from the another oscillator stage. Sources of the transistors 269 and 271 are coupled to a drain of a transistor 277. Sources of the transistors 273 and 275 are coupled to a drain of a transistor 279.

Gates of the transistors 279 and 277 are coupled to a pair of differential gain control signals G and $\overline{\text{G}}$, respectively. Sources of the transistors 277 and 279 are coupled to first ends of resistors 281 and 283 respectively. Second ends of the resistors 281 and 283 are coupled to a drain of a transistor 285. A gate of the transistor 285 is coupled to $V_{REF}$. A source of the transistor 285 is coupled to a common 287.

The second ends of the inductors 253 and 255 are also coupled to gates of transistors 289 and 295 respectively. Signals from the second ends of the inductors 253 and 255 are fed into another oscillator stage of the oscillator as a pair of differential signals FB OUT and FB_OUT, respectively.

Drains of the transistors 289 and 295 are coupled to Vcc. Sources of the transistors 289 and 295 are coupled to drains of transistors 291 and 297, respectively. Gates of the transistors 291 and 297 are coupled to $V_{REF}$. Sources of the transistors 291 and 297 are coupled to common, 293 and 299, respectively. The sources of the transistors 289 and 295 are provided as a pair of differential output signals OUT and $\overline{\text{OUT}}$, and input into a buffer of the oscillator as a pair of differential signals IN and $\overline{\text{IN}}$. At the same time, the OUT and $\overline{\text{OUT}}$ signals are output signals of the oscillator.

A differential signal R and $\overline{\text{R}}$ of the ranging circuit 268 is coupled to the FB IN and FB_IN signals from the other oscillator stage with ranging. The ranging circuit 268 is also coupled to differential ranging signals $S_0$–$S_4$ and $\overline{S_0}$–$\overline{S_4}$. $VA_1$, $VA_2$ and $T_{RES}$ signals of the ranging circuit are coupled to the second end of the first inductor 253, the second end of the second inductor 255 and the second end of the resistor 252, respectively.

FIG. 8 illustrates the ranging circuit 268 of the oscillator stage with ranging of FIG. 7. Drains of transistors 331, 335, 339 and 343 are coupled to the $VA_2$ signal which is from the second end of the second inductor 255 of FIG. 7. Drains of transistors 333, 337, 341 and 345 are coupled to the $VA_1$ signal which is from the second end of the first inductor 253 of FIG. 7. Gates of the transistors 331, 335, 339 and 343 are coupled to an OUT signal of a multiplexer circuit 330. Gates of the transistors 333, 337, 341 and 345 are coupled to an $\overline{\text{OUT}}$ signal of the multiplexer circuit 330. The multiplexer circuit 330 receives $S_4$ and $\overline{S_4}$ signals and FB IN and $\overline{\text{FB}_{13}\text{IN}}$ signals as D and $\overline{\text{D}}$ inputs and IN and $\overline{\text{IN}}$ inputs, respectively.

Figure 10:
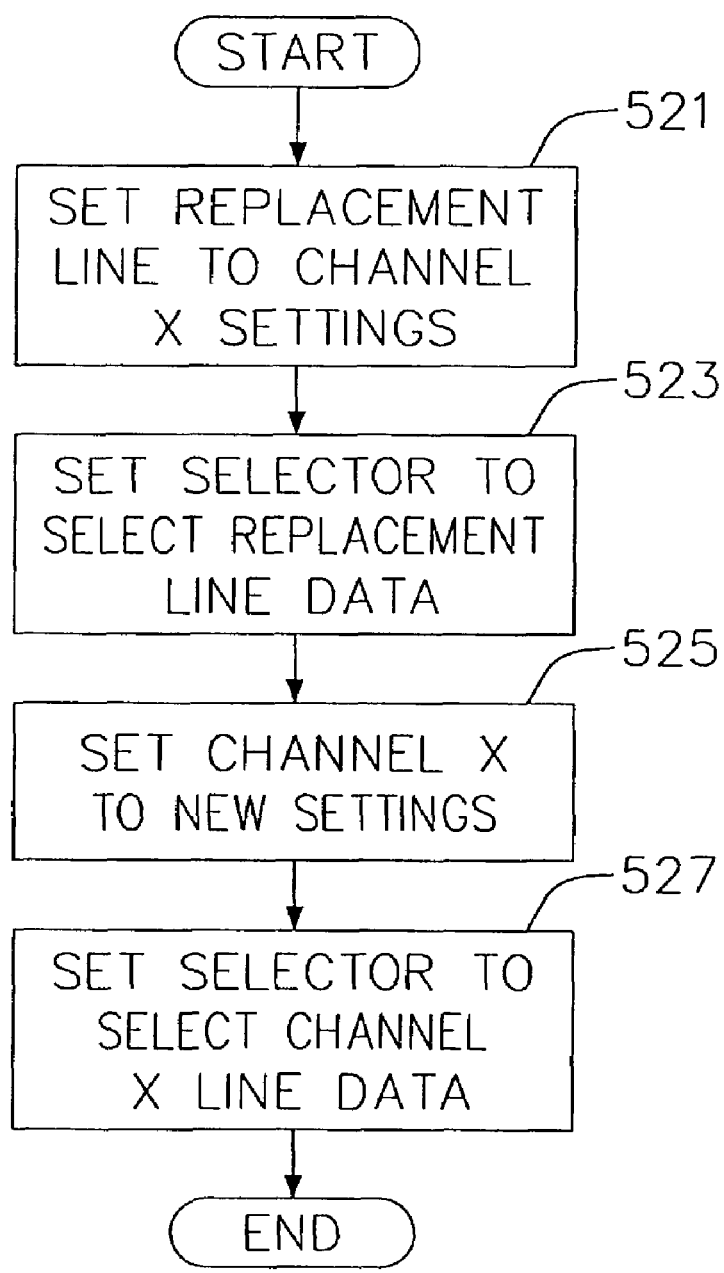
FIG. 10 is a flow diagram of a process of setting a data channel for the architecture of FIG. 9.

Sources of the transistors 331 and 333 are coupled to a drain of a transistor 347. Sources of the transistors 335 and 337 are coupled to a drain of a transistor 351. Sources of the transistors 339 and 341 are coupled to a drain of a transistor 355. Sources of the transistors 343 and 345 are coupled to a drain of a transistor 359. $T_{RES}$ signal from the second end of the resistor 252 of FIG. 10 is coupled to drains of transistors 349, 353, 357 and 361.

Gates of the transistors 347 and 349 receive a differential pair of range signals $S_0$ and $\overline{S_0}$, respectively. Gates of the transistors 351 and 353 receive a differential pair of range signals $S_1$ and $\overline{S_1}$, respectively. Gates of the transistors 355 and 357 receive a differential pair of range signals $S_2$ and $\overline{S_2}$, respectively. Gates of the transistors 359 and 361 receive a differential pair of range signals $S_3$ and $\overline{S_3}$, respectively. The differential range signals $S_0$–$S_3$ are provided by the processor or controller, and the differential range signals determine the oscillator range.

Sources of the transistors 347 and 349 are coupled to a drain of a transistor 363. Sources of the transistors 351 and 353 are coupled to a drain of a transistor 365. Sources of the transistors 355 and 357 are coupled to a drain of a transistor 367. Sources of the transistors 359 and 361 are coupled to a drain of a transistor 369. Gates of the transistors 363, 365, 367 and 369 are coupled to the reference voltage, $V_{REF}$. Sources of the transistors 363, 365, 367 and 369 are coupled to common 371, 373, 375 and 377, respectively.

Currents flowing through the transistors 349, 353, 357 and 361 will not affect the magnitude of the feedback current supplied to the oscillator stage with ranging 246 (248). Instead, they allow currents to flow through the transistors 363, 365, 367 and 369, respectively, when the transistors 347, 351, 355 and 359 are turned off. The ranging circuit 268 of FIG. 8 uses an additional pair of differential signals, $S_4$ and $\overline{S_4}$. The $S_4$ and $\overline{S_4}$ signals are used as a sign for FB IN and FB_IN signals to control a direction of a feedback current flow. In the ranging circuit 268, the feedback input signals FB IN and FB_IN are XOR'd together with the $S_4$ signal prior to being applied at the gates of the transistors 331, 333, 335, 337, 339, 341, 343 and 345. Therefore, a polarity of the feedback current is determined by the $S_4$ and $\overline{S_4}$ signals in addition to a phase offset of the feedback input signals. Thus, in essence, $S_4$ operates as a sign signal to the rest of the range signals, $S_0$–$S_3$. Further details of the oscillator of FIGS. 6–8, and other oscillators, may be found in pending U.S. patent application Ser. No. 09/322,738, filed May 28, 1999, which is incorporated by reference as if set forth herein in full.

Figure 9:
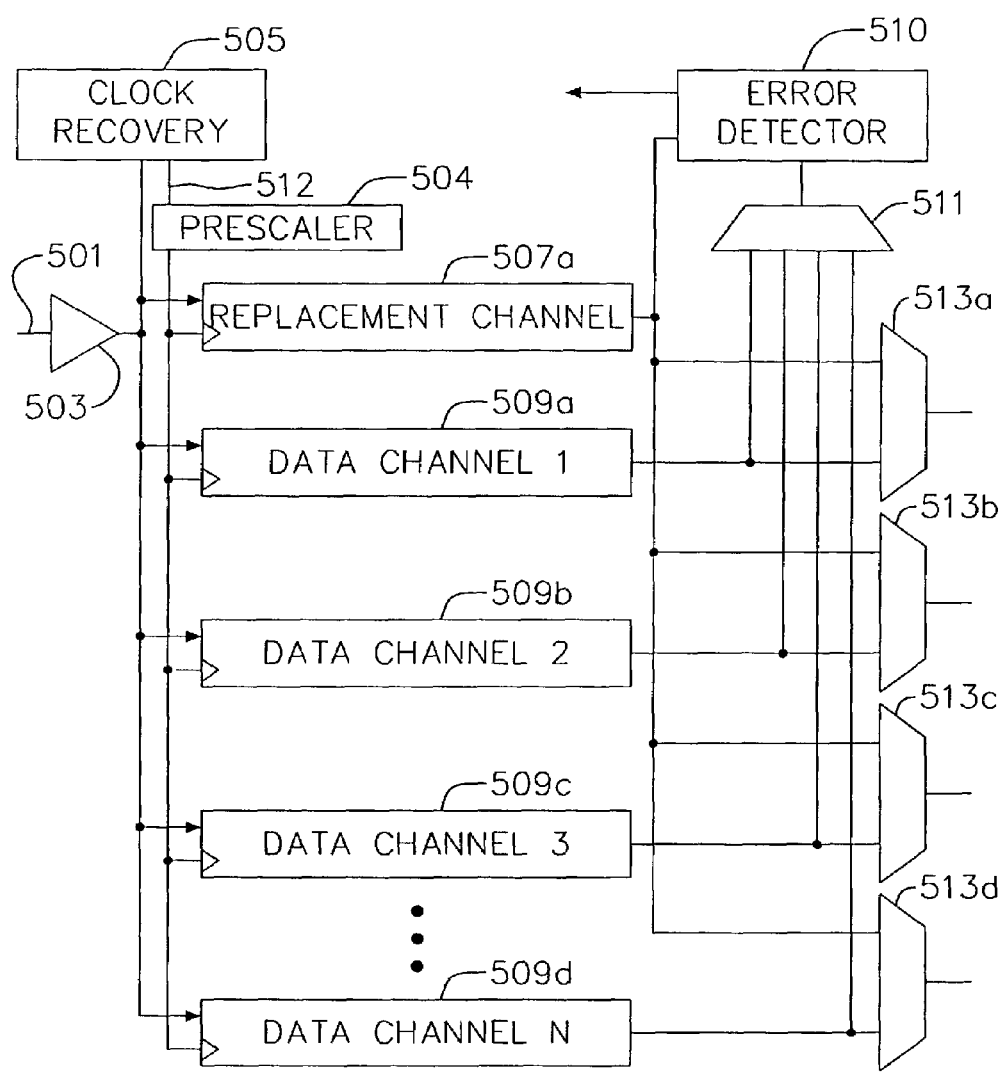
FIG. 9 is a block diagram of a multichannel architecture in accordance with the present invention.

A multiple channel architecture in accordance with aspects of the present invention is illustrated in FIG. 9. The multiple channel architecture utilizes multiple data channels and a replacement channel, i.e., monitor channel. The use of multiple data channels provides increased system capability. For example, some applications, particularly those with the potential for reduced signal integrity, utilize multiple data reads with the same data in order to determine data values. The use of multiple data channels,. all of which may be set to read a data signal at the same phase offset and voltage level, provides such a capacity. In addition, in one application each of the data channels is set so as to read a data signal at slightly varying voltages and/or phase offsets. Other applications require that the data be multiplexed from a serial input data stream, or that data be read at a rate faster than the speed of operation of the receiving circuitry. In such applications, the use of multiple data channels provides a system in which, for example, each successive data channel reads a successive bit from the data stream.

In the multiple channel architecture of FIG. 9 an input data stream 501 is provided to a transimpedance amplifier 503. Transimpedance amplifiers are commonly coupled to photo detectors to receive data from fiber optic lines. The output of the transimpedance amplifier is coupled to a clock recovery unit 505 and multiple data channels. As illustrated in FIG. 9, the acquisition channels include a replacement channel 507 and N data channels 509 a–n. The replacement channel and each of the data channels receives a data signal from the amplifier and a clock signal.

A clock signal 512 is developed by the clock recovery unit. The clock recovery unit comprises a phase locked loop (PLL). In the embodiment described, the phase locked loop includes a broad range controlled oscillator. In one embodiment the broad range controlled oscillator is an oscillator such as discussed with respect to FIGS. 6–8. In other embodiments the oscillator if a VCO of a type such as are commonly known. The clock signal is provided to a prescaler 504. The prescaler, in response to a control signal from a controller (not illustrated), divides the clock signal by an integer value. In the embodiment described the prescaler divides the clock signal by one, two, four or eight.

The output of the prescaler, a scaled clock signal, is provided to the replacement channel and the data channels. The replacement channel and the data channels are as previously described with respect to FIG. 3. Thus, for example, in one embodiment, each of the data channels or replacement channel comprises a data voltage comparator, a phase adjust circuit, and a resynchronizer. Although not illustrated, each of the replacement channel and the data channels also receives control signals from a controller to determine a phase adjustment to the scaled clock signal received by each channel and to resynchronize the data output by the channel.

The output from the replacement channel is provided to an error detector 510. The error detector is as described with respect to the other figures. The outputs of each of the data channels are provided to a multiplexer 511. The multiplexer, through a selector signal provided from a controller (not shown) selects a signal from one of the data channels. Thus, the error detector receives a signal from the replacement channel and a selected data channel. The error detector thereafter determines if the data from the two channels match.

The multichannel architecture in the embodiment illustrated in FIG. 9 also includes output multiplexers 513a–n. Each of the output multiplexers receives as one input data from the replacement channel. Each of the multiplexers also are coupled to a specific data channel. Thus, each of the multiplexers each also receive one input from one data channel. A selector signal for the multiplexers is provided by the controller. The control signal allows data output by each multiplexer to be either from a specific data channel or from the replacement channel.

A process for modifying a data channel setting, whether in phase, voltage, or both, without losing data from a data stream is illustrated in FIG. 10. In the process of FIG. 10, the replacement channel is temporarily swapped for a data channel while adjustments are made to the data channel phase and voltage settings, or slice point. In one embodiment, a replacement channel is first used to determine an appropriate set point for data sampling for both phase and voltage. This is accomplished through the use of the error detector and controller. The error detector determines data errors between the replacement channel and the selected data channel. The selected data channel's output is provided to the error detector through the multiplexer 511. Once the correct positioning for the data channel is determined, the replacement channel is set to the current phase and voltage slice settings for the selected channel (521). The output selector for the selected data channel multiplexer is then set, by the controller, to select data from the replacement channel (523). The phase and voltage slice selections from the selected data channel are then set to new settings as commanded by the controller (525). The output data selector for the selected data channel multiplexer is then set to select data from the selected channel (527). The process may then be repeated for each data channel.

Figure 11:
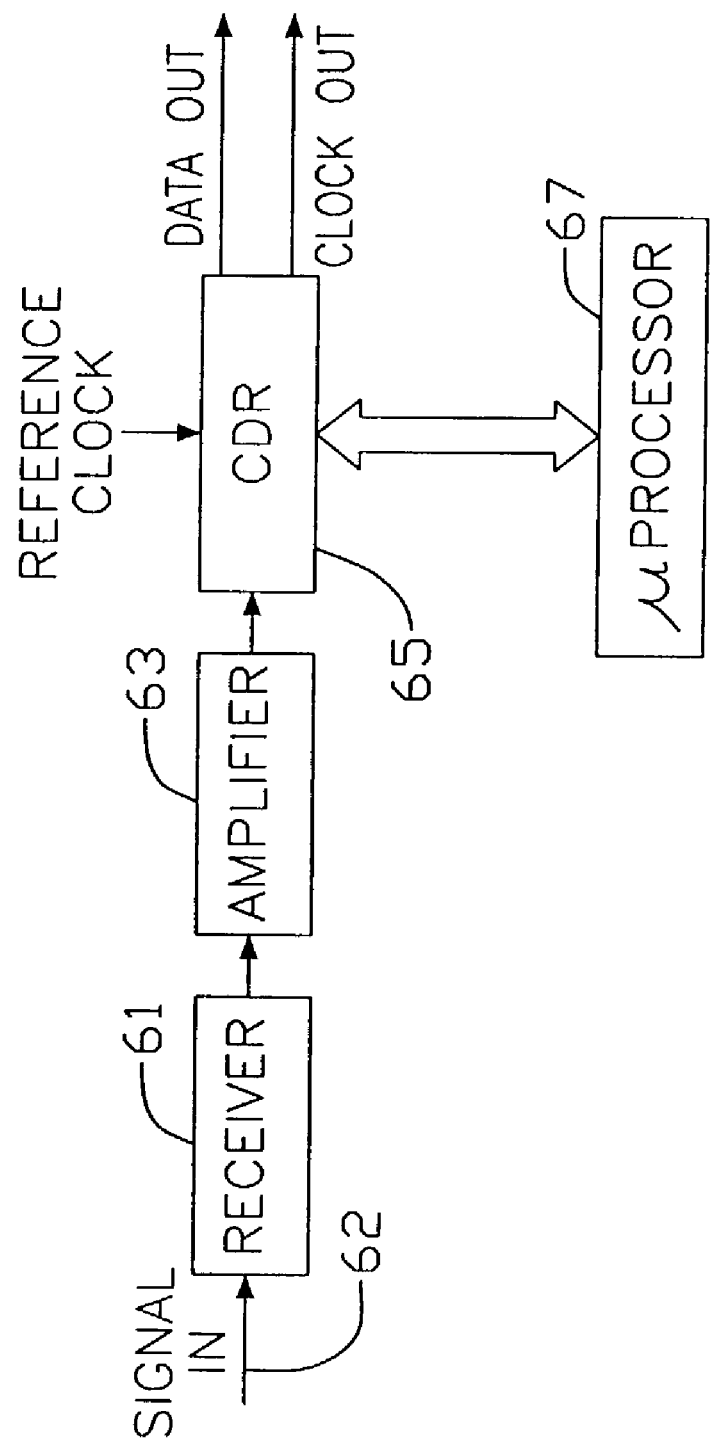
FIG. 11 illustrates a block diagram of a receiving unit.

FIG. 11 illustrates a simplified block diagram of a receiving unit incorporating the present invention. An optical receiver 61 receives an input optical signal transmitted over an optical fiber 62. The input optical signal contains digital data, which may be formatted in accordance with SONET or SDH standards. The optical receiver transforms the input optical signal to an electrical signal and provides the electrical signal to an amplifier 63. The amplifier amplifies the electrical signal to form an amplified electrical signal which is provided to a clock and data recovery unit (CDR) 65. The CDR additionally receives as an input a reference clock signal and receives and transmits a plurality of signals to and from a microprocessor 67. The CDR provides as outputs a data out signal and a clock out signal.

Figure 12:
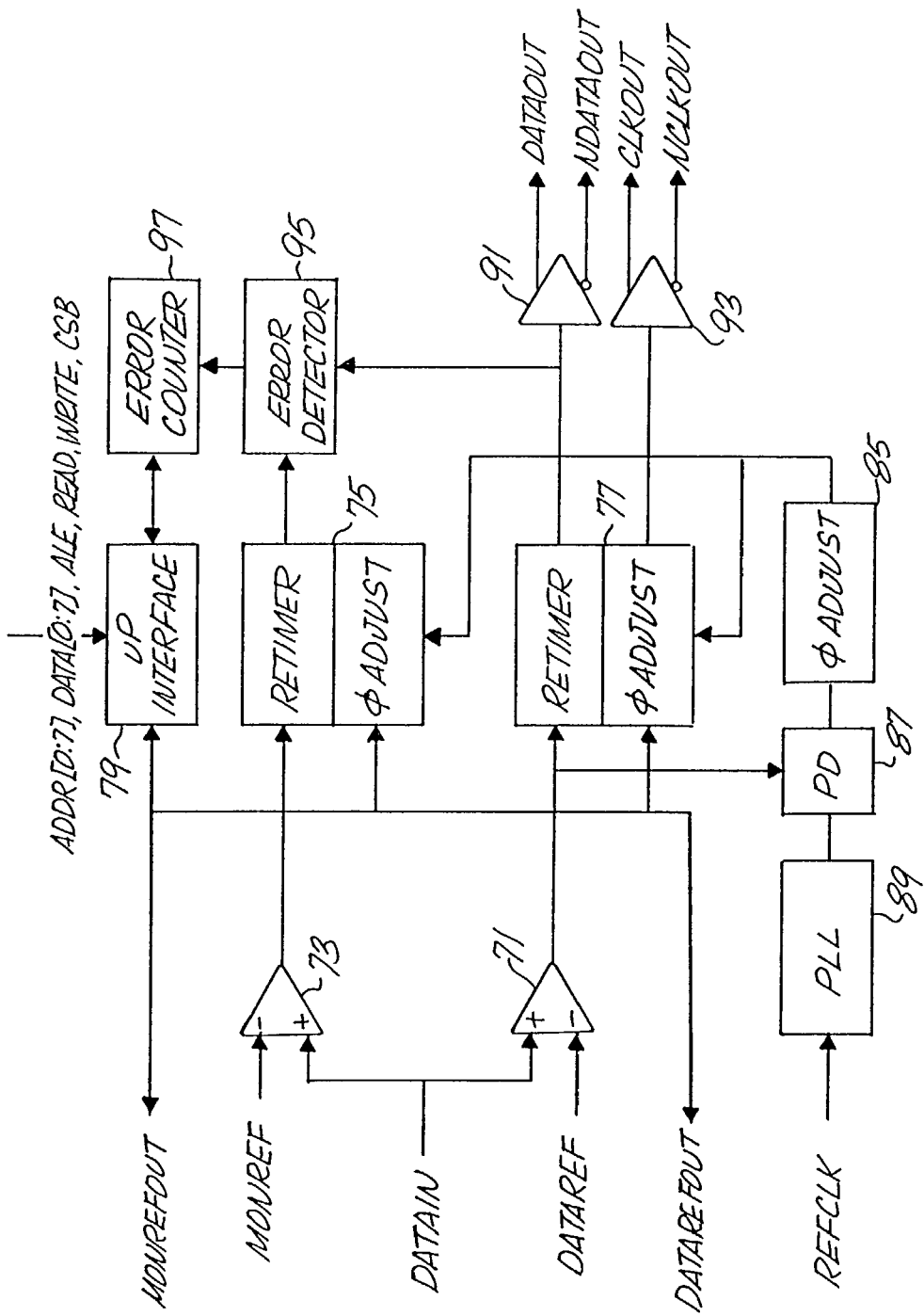
FIG. 12 illustrates a semi-schematic block diagram of a clock and data recovery unit of the receiving unit of FIG. 11.

FIG. 12 illustrates a block diagram of a clock and data recovery (CDR) unit of the system of FIG. 11. In one embodiment the CDR is provided in a single integrated circuit. The inputs to the CDR include a data-in input, a monitor reference input, a data reference input, a reference clock signal, and a microprocessor data transfer bus. The microprocessor data transfer bus is provided to a microprocessor interface 79. The microprocessor interface provides the microprocessor information related to CDR operation, and passes information from the microprocessor to the appropriate circuitry within the CDR. In one embodiment, the microprocessor interface also performs certain logic functions. These functions include the generation of the reference value and phase adjustment for the monitor channel digitization. Such functions may, in some implementations for systems with high data rates which require recentering every microsecond, necessarily be required to be executed at higher speeds than external microprocessors are capable of performing in addition to other duties placed on the microprocessor. Even in such systems, however, the microprocessor may modify the generation of the reference values and phase adjustments used in the monitor channel digitization.

For example, the microprocessor may determine that a particular sequence of reference values and phase adjustments would more fully characterize the data-eye of a data cell-than a sequence employed by the microprocessor interface and therefore command the microprocessor interface to use the particular sequence. Alternatively, the microprocessor instead may determine that the pattern of the sequence employed by the microprocessor interface is correct, but that the pattern requires an offset adjustment in voltage, phase, or both.

The data-in input corresponds to the optical receiver output signal. The data reference input signal and the monitor reference input signal are provided to a data channel comparator 71 and a monitor channel comparator 73. The data reference input and the monitor reference input are provided when the reference clock signal is provided to the PLL 89.

The outputs of the CDR include a data out (DATAOUT) signal, and its complement NDATAOUT, as well as a clock out (CLKOUT) signal and its complement, NCLKOUT. In addition, the CDR has as outputs a MONREFOUT signal and a DATAREFOUT signal. The MONREFOUT signal is generated by the microprocessor interface in response to commands from the external microprocessor, or, depending on the extent to which functions are implemented in the microprocessor interface, the microprocessor interface. The MONREFOUT signal corresponds to the desired voltage reference level for use in performing the monitor channel comparison of the data in signal. Based on the MONREFOUT signal, an external digital-to-analog converter provides the MONREF input signal. The DATAREFOUT signal is similar, but is used to generate the DATAREF input signal used in the data channel.

The data-in signal is provided to a data channel comparator 71 and a monitor channel comparator 73. The data channel comparator compares the voltage of the data-in signal with a data reference signal. The monitor channel comparator compares the data-in signal with a monitor reference signal.

The data channel comparator 71 and the monitor channel comparator 73 correspond to the data channel comparator and monitor channel comparator of FIG. 3, respectively. The PLL 89, along with a phase detecter PD 87 and phase adjuster 85 correspond to the PLL of FIG. 3. The PLL outputs a clock signal which is frequency locked to the REFCLK input signal. The clock signal output by the PLL is provided to the phase detector along with the output of the data channel comparator. The phase detector determines the phase of difference between the two input signals, and provides a phase adjust command signal to the phase adjuster 85. The phase adjuster uses the phase adjust command signal to output a master clock signal.

The phase adjusters of blocks 75 and 77 correspond to the programmable delay elements of FIG. 3, and the retimers of blocks 75 and 77 correspond to the latches of FIG. 3 and a single signal resynchronizer similar to the resynchronizer previously described.

The embodiment of FIG. 12 may be used with the microprocessor only periodically coupled to the CDR. That is, the microprocessor may be coupled to the CDR during an initial period to gather information and set a data channel compare and sample i.e., digitization, point. The CDR would thereafter operate with the data channel digitization point so set, until some time in the future when the microprocessor is recoupled to the CDR.

Figure 13:
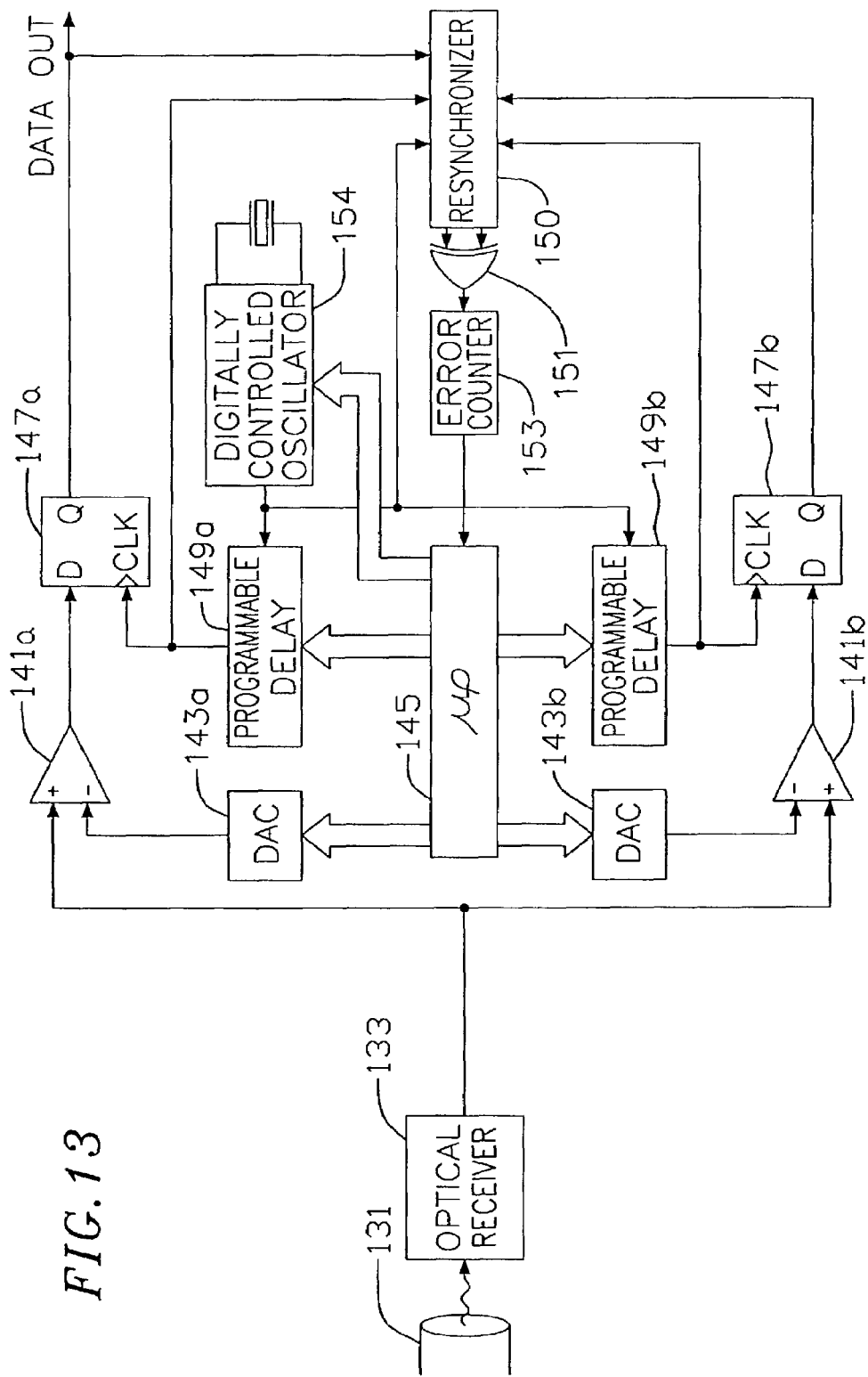
FIG. 13 illustrates a semi-schematic block diagram of an alternate embodiment of a receiving unit.

FIG. 13 illustrates another embodiment of a data recovery unit of the present invention. An incoming data signal is transmitted over a fiber optic cable 131. The fiber optic cable is coupled to an optical receiver 133. The optical receiver receives a light transmission transmitted by the fiber optic cable and converts those light transmissions into an electrical signal. The electrical signal form a data-in signal. The data-in signal is provided to a data channel comparator 141a and a monitor channel comparator 141b. The data channel comparator and the monitor channel comparator are provided reference signals by data path digital-to-analog convertor 143a and monitor channel digital-to-analog convertor 143b, respectively. The output of the data channel comparator is provided to a data channel latch 147a. The output of the monitor channel comparator is provided to a monitor channel latch 147b. The input of the data channel latch is clocked to the output of the latch every time a clock signal provided by data channel programmable delay 149a goes high. Similarly, the input of the monitor channel latch is clocked to the output of the monitor channel latch whenever a clock signal provided by a monitor channel programmable delay 149b goes high.

All of the digital-to-analog convertors and programmable delays, whether for the data channel or the monitor channel, are under the control of a controller 145. The digital-to-analog convertors are directly controlled by the controller. The programmable delays adjust a clock signal, provided by a digitally controlled oscillator 154, under the control of the controller. The controller commands the digitally controlled oscillator to operate at a frequency corresponding to the frequency of the transmitting clock. In addition, as with component aging clocks sometimes exhibit frequency drift, the embodiment of FIG. 12, as with the other embodiments, provides increased system reliability with age.

The controller receives as an input a signal indicative of the bit error rate between the data path signal and the monitor path signal. The signal indicative of the bit error rate between the data path signal and the monitor path signal is formed by providing the data channel out signal and monitor channel out signal to a resynchronizer 150, which then provides a re-synchronized data out signal and a resynchronized monitor out signal to an exclusive OR gate 151. The exclusive OR gate output is provided to an error counter 153. The error counter, which additionally receives the clock signal generated by the digitally controlled oscillator and a start command signal from the controller, is substantially similar to the error counter of FIG. 3. The error counter 153 of FIG. 5, however, begins recalculating the bit error rate between the monitor and data channels upon being commanded to do so by the controller via the start command signal, and stops recalculating the bit error rate upon completion of a predefined number of clock cycles. Thus, upon receipt of the start command the error counter resets a bit error accumulator, accumulating bit errors in the accumulator, and begins incrementing a fixed length counter every clock cycle. Once the counter reaches its upper limit a value maintained in the accumulator and the length of the counter are used to form an error counter output which provides a bit error rate indication. The error counter output is provided to the controller.

Figure 14:
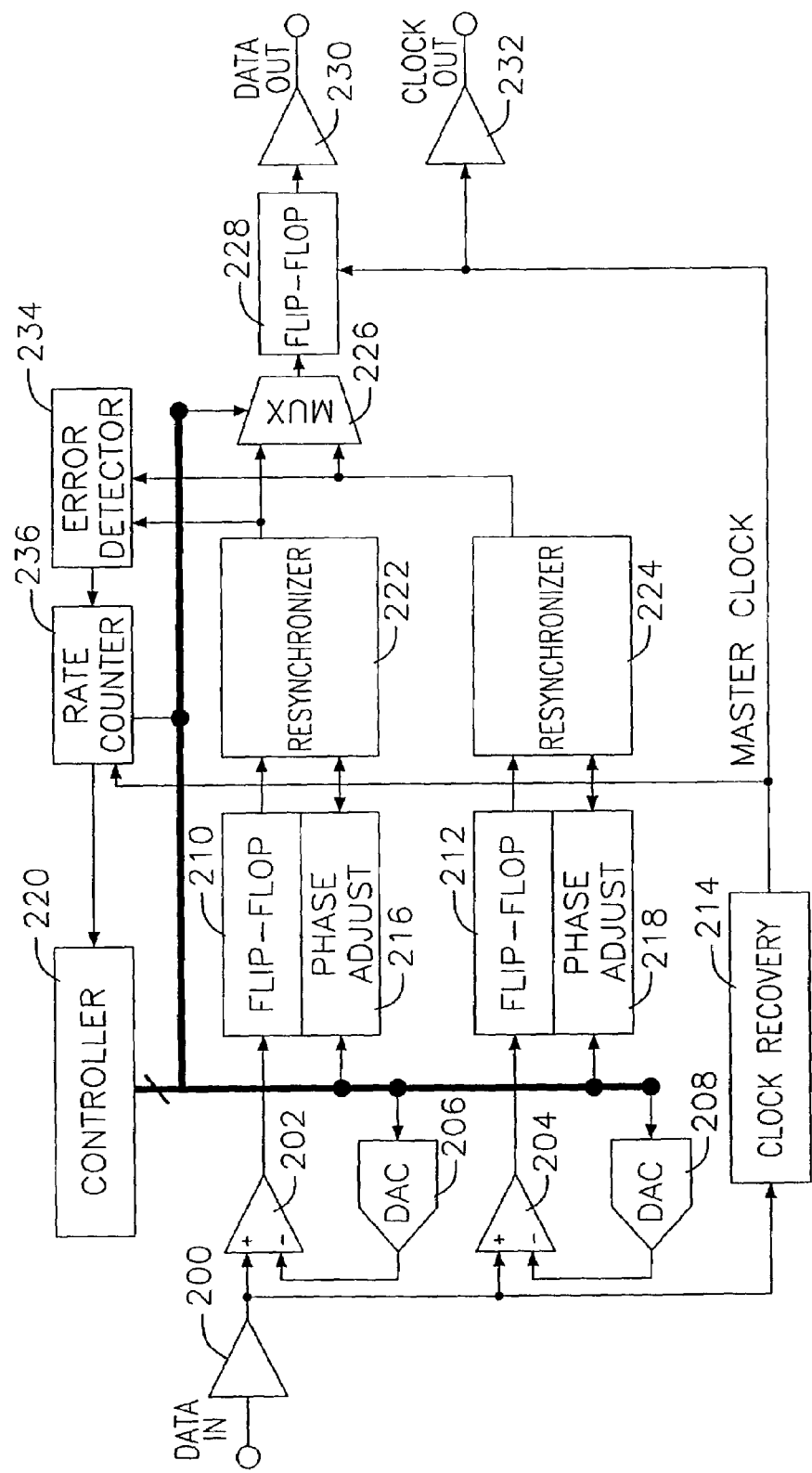
FIG. 14 illustrates a block diagram of another alternate embodiment of a receiving unit.

FIG. 14 illustrates a block diagram of another embodiment of a data recovery system. A data signal is provided to an input buffer 200. The input buffer serves to receive the data signal and drive the data signal to a first channel comparator 202, a second data channel comparator 204, and a clock recovery unit 214. The embodiment of FIG. 14, unlike the previously described embodiments, does not have a separate data channel and a separate monitor channel. Instead, first and second channels alternate as data channel and monitor channel. In effect, whenever a channel acting as the monitor channel determines a center of gravity of a data cell, the channel acting as the monitor channel has its compare and sample point placed at the center of gravity and thereafter acts as the data channel. The other channel, previously acting as the data channel, then serves as the monitor channel. Such an arrangement allows for greater accuracy as the circuitry of the receiving unit is likely to be nonideal, with small variations between the monitor path and data path channel circuitry. Such variations may result in small offsets between actual compare and sample points even when the commanded compare and sample points are identical, calibration of the two channels may minimize such offsets, but such is not required in the embodiment of FIG. 14.

The first channel comparator and the second channel comparator are provided a reference voltage from digital-to-analog convertors 206 and 208. The digital-to-analog convertors are under the control of a controller 220. The controller of the embodiment of FIG. 14, as illustrated, is an on-chip controller. The output of the input buffer is also provided to a clock recovery unit 214 which develops a master clock for the receiving unit. The master clock is adjusted by first channel phase adjuster 216 and second channel phase adjuster 218. The phase adjusters 216 and 218 provide signals which are phase adjusted versions of the master clock signal, with the amount of adjustment, or offset, accomplished according to the commands of the controller. The signals are provided as a clock input to a first channel flip flop 210 and second channel flip flop 212. The output of the flip flops 210,212 therefore correspond to the data out signal and monitor out signal of the previously described embodiments. Of course, at any given time either the first channel or the second channel may be acting as the data channel, with the other channel acting as the monitor channel.

The output of the flip flops 210 and 212, as well as the signals which are phase adjusted versions of the master clock signal, are additionally provided to resynchronizers 250a,b. The resynchronizers are also provided for the master clock signal. Because of the differences in the adjustment of the phase of the master clock signal for the two signals to the flip flops 210 and 212, the outputs of the two flip flops will be slightly skewed in time. The purpose of the resynchronizer therefore is to resynchronize the two signals, as well as to provide the error detector data and monitor signals derived from a single data cell. The outputs of the resynchronizers are also provided to a MUX 226. The MUX is provided a select signal by the controller, which maintains information as to which channel is serving as the data channel at any given point in time. The channel serving as the data channel output is selected by the MUX and passed to a flip flop 228. The flip flop 228 also receives the master clock signal. The output of the flip flop 228 is provided to an output buffer for driving a data out signal. The master clock signal is also provided to a output buffer 232 for driving a clock out signal.

In addition to being provided to the MUX, the outputs of the resynchronizer are also provided to an error detector 234. The error detector determines if differences exist between the outputs of the resynchronizer. The error detector provides a signal to a rate counter 236, which provides bit error rate information to the controller 220. The controller uses this bit error rate information as previously described to determine the center of gravity of data cells.

Figure 15:
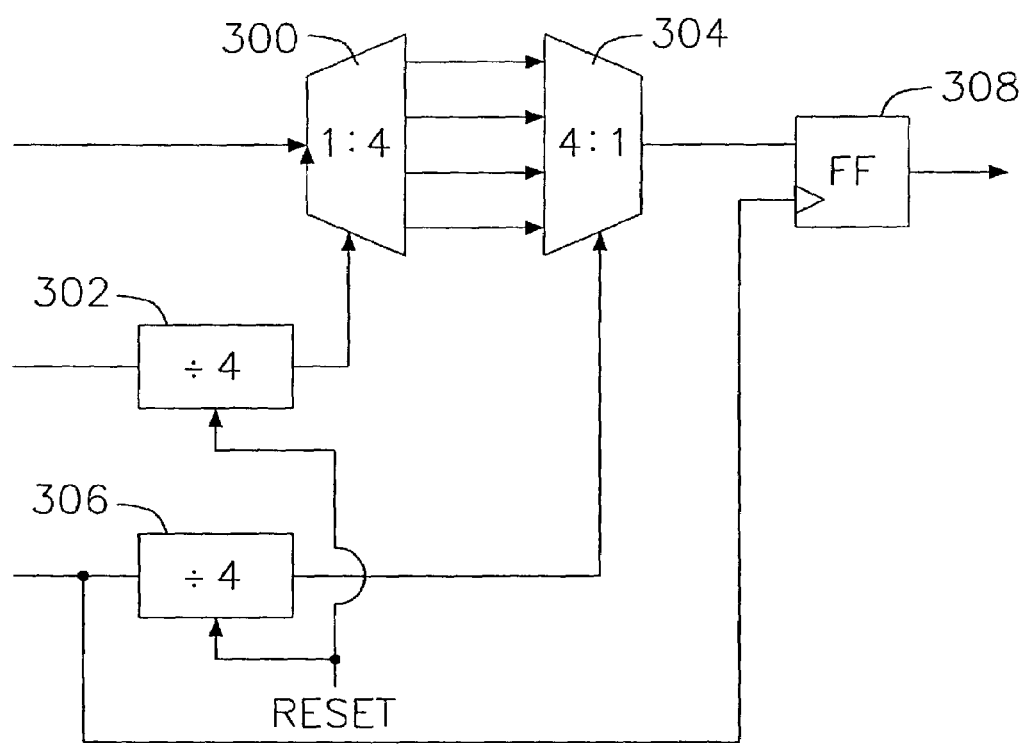
FIG. 15 illustrates a block diagram of a resynchronizer.

FIG. 15 illustrates a resynchronizer block. A data in signal, which corresponds to either the data out signal or the monitor out signal, is provided to a time division demultiplexer 300. The time division demultiplexer is a 1 to 4 demultiplexer. Therefore, the time division demultiplexer is a 1:4 time division DMUX. A time division demultiplexer selector signal is generated by passing a variable clock signal through a divide by 4 block 302. The variable clock signal corresponds to the phase adjusted master clock signal, from either the data channel or the monitor channel of the previously described embodiments. Accordingly, the demultiplexer selector signal is a clock signal corresponding to the phase adjusted master clock signal, but with a period four times as great.

The outputs of the time division DEMUX are provided to a time division multiplexer 304. The time division multiplexer uses a multiplexer selector signal generated by passing the master clock signal through a divide by 4 block 306. Accordingly the time division multiplexer selector signal corresponds to the master clock signal, but with a period four times as great. The divide by 4 blocks 302, 306 are also provided a reset signal. The reset signal causes the outputs of the divide by 4 block to reset in opposite phase. Accordingly, as the variable clock signal and the master clock signal correspond in frequency and are no more than one cycle apart in phase shift, after being reset the output of the divide by 4 blocks are approximately 180°0 out of phase, with no more than an additional phase shift corresponding to one period of the master clock cycle.

The output of the time division multiplexer is provided to a flip flop 308. The flip flop uses the master clock signal as a clock signal input. The output of the flip flop is therefore resynchronized to the master clock signal. In addition, as both the data out signal and a monitor out signal are each provided to a resynchronizer so described, the corresponding output from a pair of resynchronizers are guaranteed to each be derived from a compare and sample of the same data cell.

Figure 16:
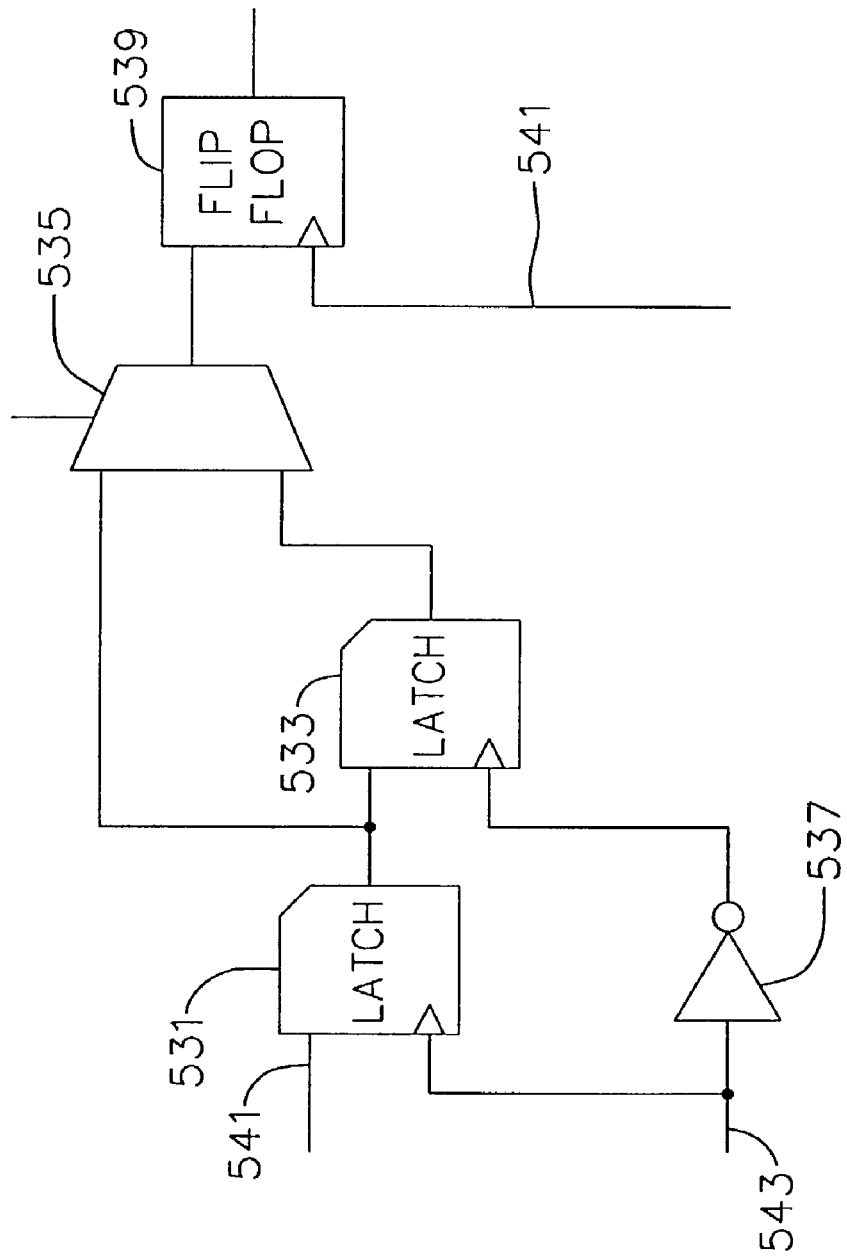
FIG. 16 is a semi-schematic block diagram of an alternate resynchronizer of the present invention.

An alternate resynchronizer for a channel, or half of a two-channel resynchronizer, is illustrated in FIG. 16. A first latch 531 receives a data in signal 541. The data in signal corresponds to the data out signal or the monitor out signal, depending on whether the resynchronizer is connected to a data channel or a monitor channel. The first latch is a clocked latch, and the first latch receives as its clock input the phase adjusted clock signal 543 used by the channel from which the resynchronizer receives its data input. The output of the first latch is provided as a data input to a second latch 533 and to a multiplexer 535. The second latch, which is also a clocked latch, receives as its clock input an inverted version of the phase adjusted clock signal used by the channel. In other words, an inverter 537 is placed in the clock signal path between the clock input of the first latch and the clock input of the second latch. Alternatively, if a differential clock signal is used the compliment of the clock signal is used without requiring the inverter. In one embodiment, the first and second latches are triggered when the clock signal is high. The second latch also provides its output to the multiplexer. The output from the multiplexer is provided to a flip flop 539 which receives the master clock signal 541 as its clock input. The output of the flip flop forms the output of the resychronizer, with the output of the resychronizer synchronized to the master clock.

The data output from the second latch is delayed by a half clock cycle, i.e., 180 degrees, from the data output of the first latch. The multiplexer therefore is used to select one of two data signals, with one of the signals being delayed by half a clock cycle, or 180 degrees, from the other data signal. The selection signal to the multiplexer is provided by the controller.

The controller sets the selection signal in order to allow the error detector to compare data signals from a single data cell. In other words, the error detector compares data signals from two data channels, generally the monitor channel and the data channel when two channels are being utilized. The phase adjusted clock signals of the two channels, however, have an arbitrary phase relationship to one another. Accordingly, to ensure that data clocked from the resynchronizers using the master clock signal represent data from the same data cell, it may be necessary to adjust the phase relationship of the data. Using the resynchronizer of FIG. 16 for two channels, one channel may be selected such that its data is phase shifted positive 180 degrees, not phase shifted, or phase shifted negative 180 degrees with respect to data from the other data channel. For example, the controller may select data from the first latch in a first resynchronizer, and data from the second latch in a second resynchronizer. The data from the second resynchronizer, therefore, is phase shifted by 180 degrees with respect to the data from the first resynchronizer.

The controller determines whether to obtain data from the first latch or the second latch for two resynchronizers by setting the control signals to the multiplexers to each of the four possible combinations of latch outputs. The controller then monitors the error rate between the two data channels and appropriately determines which latch output to use. Generally speaking, the master controller will select latch outputs which produce the minimum number of errors. In other embodiments, the master controller selects latch outputs which produce errors which are not approximate 50%, if the signal has a uniform data density of logical zeros and logical ones.

Figure 17:
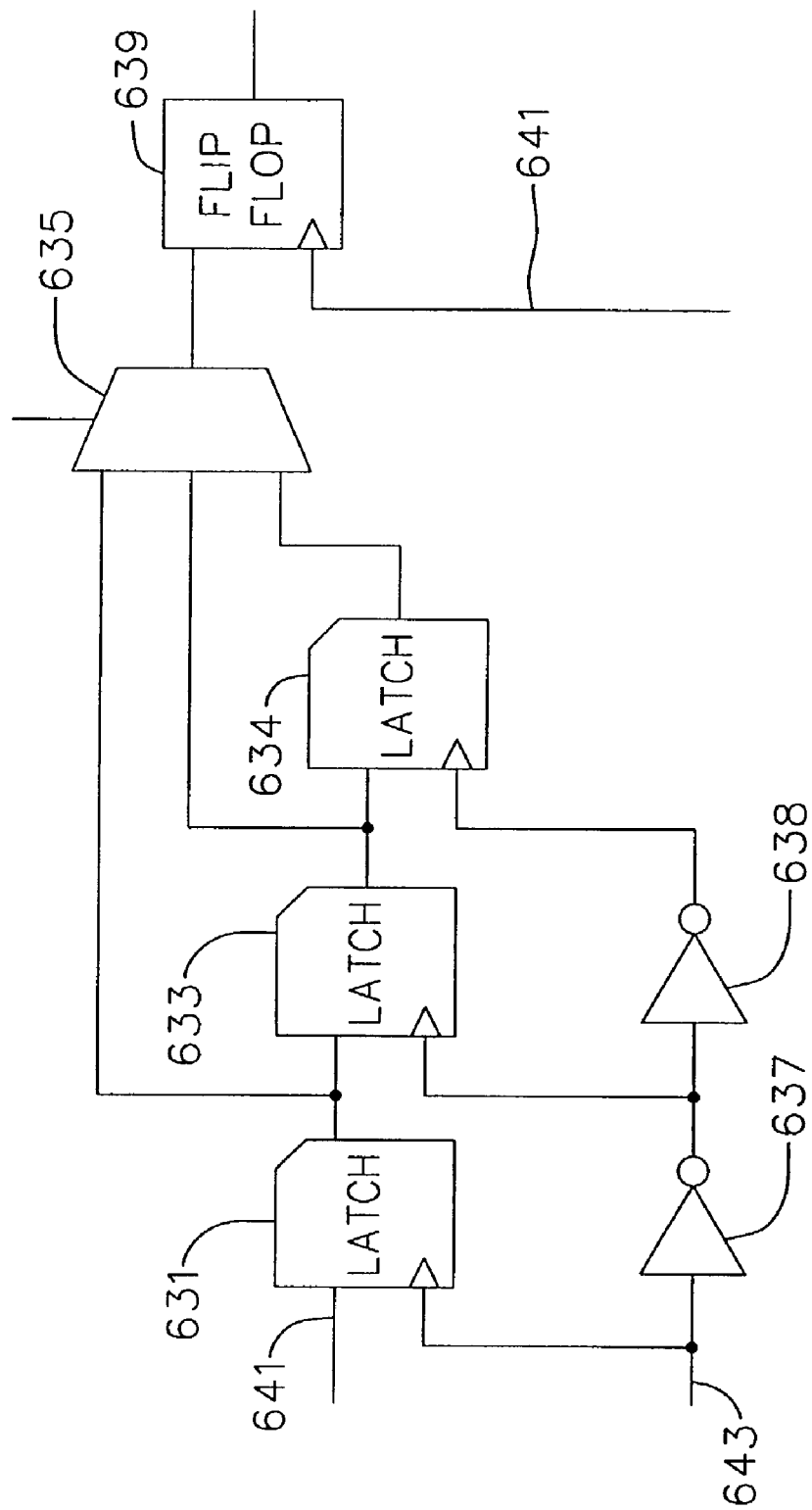
FIG. 17 is a semi-schematic block diagram of a further alternate resynchronizer of the present invention.

A further alternate embodiment of the resynchronizer is illustrated in FIG. 17. The further alternate embodiment of FIG. 17 is similar to that of FIG. 16. However, in the resynchronizer illustrated in FIG. 17 an additional latch 634 provides an input to the multiplexer. The additional latch receives as its data input the data output of the second latch 633. The additional latch receives as its clock input the phase adjusted clock signal. Thus, the further alternative embodiment of the resynchronizer allows data from the two resynchronizers to be phase shifted by 360 degrees with respect to one another.

However, in one embodiment the controller provides that the selection signal for a multiplexer 635 for the active data channel selects data from the second, or middle, latch 633. The controller also, in series, selects data from each of the first latch, the second latch, and the third latch from the sampling data channel. This allows the controller to compare data which is phase shifted positive 180 degrees, neither advanced nor retarded, or phase shifted negative 180 degrees from the active data channel. The controller thereafter, based on bit error rates and as previously described, determines which latch to obtain data from. An advantage of the three-stage latch resynchronizer is that potentially data may be lost or overwritten during changes in the selected latch in the active data channel. In the three-stage version the active data channel maintains data from a single latch, and therefore the risk of data corruption is reduced.

Figure 18:
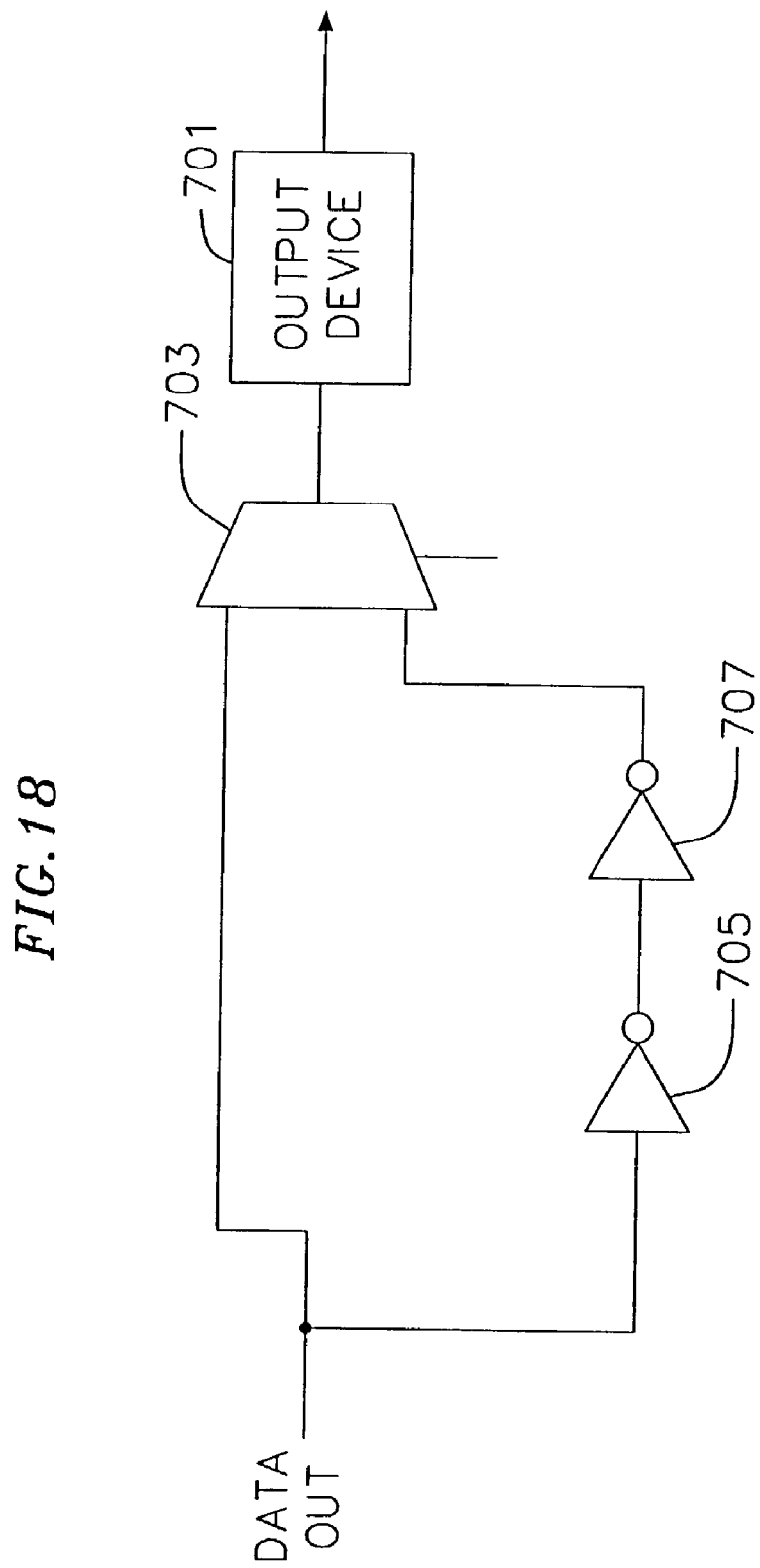
FIG. 18 is a semi-schematic block diagram of a modulator of the present invention.

In accordance with another aspect of the present invention, the monitor channel is used to determine changes in the data eye, with the changes in the data eye being caused by a sender of the data. The changes in the data eye, therefore, contain additional information, or data, thereby allowing for increased data throughput. An example of data modulation provided by a sender of the data is illustrated in FIG. 18. As illustrated in FIG. 18, data to be transmitted through a transmission link by way of an output device 701 is first provided to a multiplexer 703. The data is also passed through a first inverter 705 and a second inverter 707, with the output of the second inverter also being provided to the multiplexer. The two inputs to the multiplexer therefore are slightly shifted in phase with respect to each other. A control signal generated by a data output controller (not shown) selects one of the signals input to the multiplexer for transmission through the transmission line. By changing the selection of which data signal to pass through the data output device the controller can introduce jitter or phase offset, in the output data stream.

Upon receipt of the transmitted data, a data channel, which may be the monitor channel, determines whether the received data signal has been slightly offset in phase. Thus, for a specific clock data rate, the effective data rate may be increased through the modulation of the rate at which data is clocked through the transmission line.

Accordingly, the present invention provides a system and methodology for recovering data from an incoming data stream. Although this invention has been described in certain specific embodiments, many additional modifications and variations would be apparent to those skilled in the art. It is therefore to be understood that this invention may be practiced otherwise than is specifically described. Thus, the present embodiments of the invention should be considered in all respects as illustrative and not restricted, the scope of the invention to be indicated by the appended claims and their equivalents rather than the foregoing description.

What is claimed is:

1. A method of determining a data rate comprising:
providing a data stream to a phase locked loop (PLL) including an oscillator having a plurality of ranges;
setting the oscillator to a first range;
determining if the PLL locks to a potential data rate of the data stream;
measuring for a data eye within a data cell defined by the potential data rate; and
setting the oscillator to a second range if the measurements for the data eye are inconsistent with an expected data eye for the potential data rate.

2. The method of claim 1 wherein measuring for a data eye within a data cell defined by the potential data rate comprises:
sampling the data stream at the potential data rate, the sampling occurring at a constant phase;
sampling the data stream at the potential data rate, the sampling occurring at a variable phase; and p1 comparing the results of the sampling at the constant phase with the sampling at the variable phase for common data cells.

3. The method of claim 1 wherein determining if the PLL locks to a potential data rate of the data stream comprises determining if a loop bias filter voltage is approximately constant over time.

4. The method of claim 1 wherein determining if the PLL locks to a potential data rate of the data stream comprises determining if a loop bias filter voltage is within a specified range.

5. The method of claim 4 wherein determining if a loop bias filter voltage is within a specified range comprises examining a register indicating status of the loop bias filter voltage.

6. The method of claim 5 wherein the register includes a bit indicating that the loop bias filter voltage exceeds a specified voltage and a bit indicating that the loop bias filter voltage is below a specified voltage.

7. The method of claim 1 wherein measuring for a data eye within a data cell defined by the potential data rate comprises comparing data sampled at the potential data rate with approximately zero phase offset with data sampled at the potential data rate with approximately 180 degree phase offset.

8. The method of claim 7 wherein measurements for the data eye are inconsistent with an expected data eye for the potential data rate if results of the comparison of data sampled at the potential data rate with approximately zero phase offset with data sampled at the potential data rate with approximately 180 degree phase offset does not indicate appreciable differences.

9. The method of claim 8 wherein appreciable differences are differences in approximately 50 percent of compared bits.

10. A method of determining a data rate comprising:
providing a data stream to a clock recovery circuit;
determining, using the clock recovery circuit, a proposed data rate for the data stream;
providing the data stream to a channel;
sampling, the data stream on the channel at the proposed data rate;
changing the phase of the sampling with respect to a clock signal at the proposed data rate;
determining whether data transition boundaries for the data stream are in accordance with the proposed data rate; and
wherein determining whether data transition boundaries for the data stream are in accordance with the proposed data rate comprises determining if bit error rates increase at expected data transition boundaries.

11. A method of determining a data rate comprising:
providing a data stream to a clock recovery circuit;
determining, using the clock recovery circuit, a proposed data rate for the data stream;
providing the data stream to a channel;
sampling, the data stream on the channel at the proposed data rate;
changing the phase of the sampling with respect to a clock signal at the proposed data rate;
determining whether data transition boundaries for the data stream are in accordance with the proposed data rate; and
wherein determining whether data transition boundaries for the data stream are in accordance with the proposed data rate comprises determining if differences between data sampled at zero phase offset and data sampled at 180 degree phase offset are significant.

12. A method of determining a data rate comprising:
providing a data stream to a clock recovery circuit;
determining, using the clock recovery circuit, a proposed data rate for the data stream;
providing the data stream to a channel;
sampling, the data stream on the channel at the proposed data rate;
changing the phase of the sampling with respect to a clock signal at the proposed data rate;
determining whether data transition boundaries for the data stream are in accordance with the proposed data rate;
wherein determining whether data transition boundaries for the data stream are in accordance with the proposed data rate comprises determining a differential error count; and
wherein the differential error count is the difference between error counts for a zero phase offset and a 180 degree phase offset.

* * * * *

UNITED STATES PATENT AND TRADEMARK OFFICE
CERTIFICATE OF CORRECTION

PATENT NO. : 6,996,202 B2  Page 1 of 1
APPLICATION NO. : 10/266383
DATED : February 7, 2006
INVENTOR(S) : Gary D. McCormack et al.

It is certified that error appears in the above-identified patent and that said Letters Patent is hereby corrected as shown below:

Claim 2, Col. 20, line 40
"p1" should be deleted

Claim 10, Col. 21, line 14
"," should be deleted

Claim 11, Col. 21, line 30
"," should be deleted

Claim 12, Col. 22, line 16
"," should be deleted

Signed and Sealed this

Twelfth Day of August, 2008

JON W. DUDAS
*Director of the United States Patent and Trademark Office*